(12) United States Patent
Pandey et al.

(10) Patent No.: US 10,079,308 B1
(45) Date of Patent: Sep. 18, 2018

(54) VERTICAL TRANSISTOR STRUCTURE WITH LOOPED CHANNEL

(71) Applicant: GLOBALFOUNDRIES INC., Grand Cayman (KY)

(72) Inventors: Shesh Mani Pandey, Saratoga Springs, NY (US); Hui Zang, Guilderland, NY (US); Josef S. Watts, Stillwater, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/682,631

(22) Filed: Aug. 22, 2017

(51) Int. Cl.
| | |
|---|---|
| *H01L 21/70* | (2006.01) |
| *H01L 29/786* | (2006.01) |
| *H01L 21/768* | (2006.01) |
| *H01L 29/66* | (2006.01) |
| *H01L 21/8234* | (2006.01) |

(52) U.S. Cl.
CPC .. *H01L 29/78642* (2013.01); *H01L 21/76829* (2013.01); *H01L 21/823412* (2013.01); *H01L 29/66643* (2013.01); *H01L 29/66666* (2013.01); *H01L 29/66742* (2013.01); *H01L 29/66833* (2013.01)

(58) Field of Classification Search
CPC ......... H01L 29/78642; H01L 21/76829; H01L 21/823412; H01L 29/66643; H01L 29/66666; H01L 29/66742; H01L 29/66833; H01L 27/11273; H01L 27/2454; H01L 29/66795; H01L 29/7831; H01L 29/785
USPC ......... 257/288, 368, 369; 438/151, 197, 199
See application file for complete search history.

(56) References Cited

U.S. PATENT DOCUMENTS

| | | | |
|---|---|---|---|
| 8,203,182 B2 | 6/2012 | Muller et al. | |
| 9,190,466 B2 | 11/2015 | Basker et al. | |
| 9,299,835 B1 * | 3/2016 | Anderson | ........... H01L 29/7827 |
| 9,768,072 B1 * | 9/2017 | Cheng | ............. H01L 21/823487 |
| 2012/0235234 A1 | 9/2012 | Chang et al. | |

FOREIGN PATENT DOCUMENTS

CN 102832133 A1 12/2012

* cited by examiner

*Primary Examiner* — Shahed Ahmed
(74) *Attorney, Agent, or Firm* — Yuanmin Cai; Hoffman Warnick LLC

(57) ABSTRACT

The disclosure provides a vertical FinFET structure, including: a substrate including a first source/drain region; a looped channel region positioned on the first source/drain region of the substrate, the looped channel region having an inner perimeter which surrounds a hollow interior of the looped channel region; a first gate positioned within the hollow interior of the looped channel region, wherein the first gate is formed onto the looped channel region along the inner perimeter of the looped channel region; and a second source/drain region positioned on and overlying an upper surface of the looped channel region.

20 Claims, 22 Drawing Sheets

US 10,079,308 B1

VERTICAL TRANSISTOR STRUCTURE WITH LOOPED CHANNEL

BACKGROUND

Technical Field

The present disclosure relates to the processing of vertical fin field effect transistor (vertical FinFET) devices of an integrated circuit (IC) structure, and more particularly, to vertical FinFET structures which include a looped channel region.

Related Art

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Conventionally, FETs are horizontal wherein the source and drain regions are adjacent to one other on or within the substrate, and the gate region is disposed laterally between the source and drain regions in the substrate. However, vertical transistors have recently become of interest in the field. Vertical transistors (vertical FinFETs) differ from conventional FETs in that one of the source and/or drain regions is located above the other source and/or drain region(s) with the gate region positioned vertically therebetween. The physical differences between vertical FinFETs and other transistors may be associated with corresponding differences in processing and device performance. Development of other transistor architectures, e.g., nanosheet transistors, have yielded dimensional improvements such as "gate all around" (GAA) device architectures. GAA architectures are structured to wrap completely around semiconductor channel material within a two dimensional space. This arrangement may improve the contact area between these two elements and therefore allow easier formation of conductive regions in the semiconductor channel. In the case of a vertical FinFET, the conventional structure of a gate wrapping around a vertically-oriented semiconductor channel region may limit the ability to use technical improvements designed for different transistor structures. The conventional vertical FinFET structure may also impose limitations on further improvement and/or integration into device structures with more complicated technical specifications, e.g., devices with increasingly high pattern densities.

SUMMARY

A first aspect of the disclosure provides a vertical FinFET structure, including: a substrate including a first source/drain region; a looped channel region positioned on the first source/drain region of the substrate, the looped channel region having an inner perimeter which surrounds a hollow interior of the looped channel region; a first gate positioned within the hollow interior of the looped channel region, wherein the first gate is formed onto the looped channel region along the inner perimeter of the looped channel region; and a second source/drain region positioned on and overlying an upper surface of the looped channel region.

A second aspect of the disclosure provides a vertical FinFET structure, including: a substrate including a first source/drain region; a looped channel region positioned on the first source/drain region of the substrate, the looped channel region having an inner perimeter which surrounds a hollow interior of the looped channel region; an insulator region positioned on the substrate and within the hollow interior of the looped channel region, wherein the insulator region is formed onto the looped channel region along the inner perimeter of the looped channel region; and; a first gate positioned within the hollow interior of the looped channel region, wherein the first gate is formed onto the looped channel region along the inner perimeter of the looped channel region; and a second source/drain region positioned on and overlying an upper surface of the looped channel region.

A third aspect of the disclosure provides a vertical FinFET structure, including: a substrate including a first source/drain region; a looped channel region positioned on the first source/drain region of the substrate, the looped channel region having an inner perimeter which surrounds a hollow interior of the looped channel region; a first gate positioned within the hollow interior of the looped channel region, wherein the first gate is formed onto the looped channel region along the inner perimeter of the looped channel region, wherein the first gate includes: a gate dielectric formed onto the inner perimeter of the looped channel region, the gate dielectric having an inner perimeter which surrounds a hollow interior of the gate dielectric, and a conductive gate region positioned within the hollow interior of the gate dielectric, wherein the gate dielectric formed onto the conductive gate region along the inner perimeter of the gate dielectric; a second gate formed onto the looped channel region along an outer perimeter of the looped channel region, wherein the looped channel region is directly interposed between the first and second gates; and a second source/drain region positioned on and overlying an upper surface of the looped channel region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The disclosure provides a vertical fin-type field effect transistor (referred to herein as "vertical FinFET") structure. Vertical transistors may be distinguished from other transistor configurations, e.g., MOSFET, FinFET, tunnel FET, and/or other types of transistors, by including a set of vertically stacked regions. For instance, a vertical transistor may include a source region positioned vertically beneath a gate region to the transistor, with an insulator vertically separating the gate from the source. Similarly, a drain region of the transistor may be positioned above and vertically separated from the gate region, e.g., with another insulating material. Contacts to the source, drain, and/or gate regions of a vertical transistor may be positioned laterally adjacent to the device in a shared dielectric layer in a spaced arrangement. Such vertical transistor structures are a contrast to other devices, e.g., where contacts to the various regions only extend vertically to the transistor through overlying layers.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The vertical FinFET structures provided herein include a channel region structured to loop about and surround a hollow interior. A first gate is positioned inside the hollow interior of the looped channel region, and a second gate additionally may be positioned outside the looped channel region to provide structurally independent gate regions of the transistor structure. Vertical FinFETs with a looped channel region circumscribing a gate region of the transistor provide a greater amount of contact area between the channel and gate regions of the transistor. This increased amount of contact area may improve device reliability while reducing the amount of space occupied by the vertical FinFET transistor. Operational methodologies to form a vertical FinFET according to the disclosure are provided herein to emphasize the relative positions of each component in the vertical FinFET structure, and to further explain structural distinctions of the FinFET structure relative to conventional device architectures.

Figure 1:
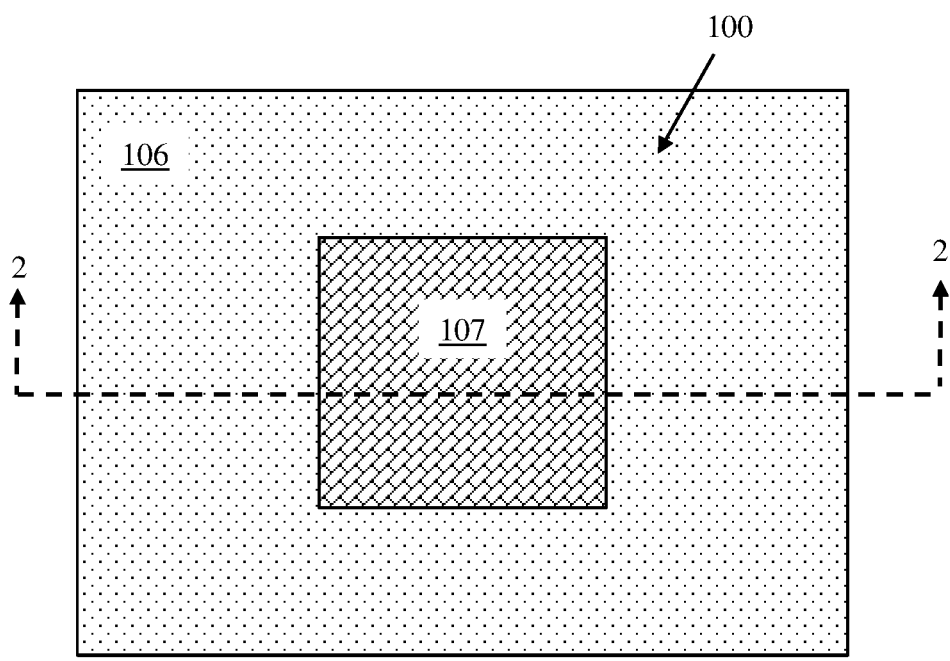
FIG. 1 provides a plan view of a semiconductor substrate to be processed according to the disclosure.
Figure 2:
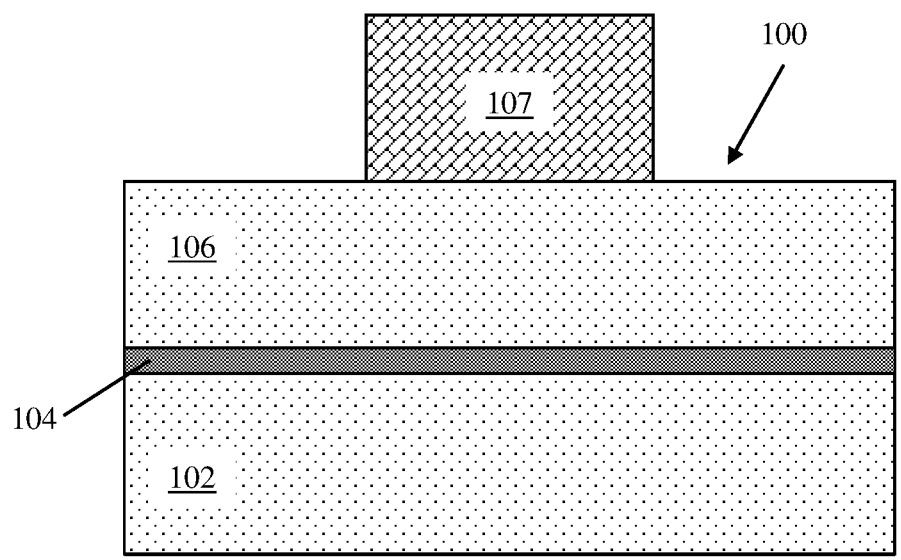
FIG. 2 provides a cross-sectional view of the semiconductor substrate to be processed according to the disclosure.

Referring initially to FIGS. 1-2, a precursor structure 100 is shown. Precursor structure 100 may include a set of initial materials to be modified into a vertical FinFET structure according to the various techniques described herein. FIG. 1 provides a plan view of precursor structure 100, while FIG. 2 provides a cross-sectional view of precursor structure 100 along line 2-2 in FIG. 1.

Precursor structure 100 may include a substrate 102 (shown in FIG. 2 only). As shown, substrate 102 may include any currently-known or later developed material capable of being processed into a functional transistor, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained.

Substrate 102 of precursor structure 100 may be formed by forming a semiconductor material on an underlying structure. According to an example, substrate 102 may be formed by deposition and/or wafer bonding, e.g., separation by implantation of oxygen (SIMOX). As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

Precursor structure 100 may include a substrate mask 104 positioned on the upper surface of substrate 102. Substrate mask 104 may cover substrate 102 to protect the semiconductor material of substrate 102 from being removed, etched, altered, etc., when precursor structure 100 is initially modified to create the shape of a looped channel region. Initially, substrate mask 104 may take the form of a single layer of masking material which coats and overlies the upper surface of substrate 102. In precursor structure 100, the entirety of substrate 102 is covered by substrate mask 104. Substrate mask 104 may include one or more currently known or later developed types of masking materials configured to protect underlying structures from being etched. As examples, substrate mask 104 may include without limitation silicon dioxide and/or silicon nitride, or any other hard mask material known in the art.

Precursor structure 100 may include components which determine the size and position of a vertical FinFET channel region. One such material in precursor structure 100 is a sacrificial semiconductor layer 106 overlying substrate mask 104. In precursor structure 100, sacrificial semiconductor layer 106 rests on an upper surface of substrate mask 104, and initially covers the entirety of substrate mask 104. Sacrificial semiconductor layer 106 may have an identical composition to that of substrate 102, or may be composed of another semiconductor material. In any case, sacrificial semiconductor layer 106 is included in precursor structure 100 in order to be patterned and etched to form a semiconductor mandrel (i.e., semiconductor mandrel 108 described below relative to FIGS. 3-4) for defining the shape of a channel region for a transistor. A mandrel mask 107 may be positioned directly on sacrificial semiconductor layer 106. Mandrel mask 107 may cover a targeted portion of sacrificial semiconductor layer 106 for defining the shape of a semiconductor mandrel. Mandrel mask 107 may include any currently known or later developed masking material appropriate for targeting portions of a semiconductor material, and may have a composition similar to or different from that of substrate mask 104. Mandrel mask 107 may be designed to have substantially the same shape and surface area as the gate of a transistor to be surrounded by a looped channel region, as discussed below.

Figure 3:
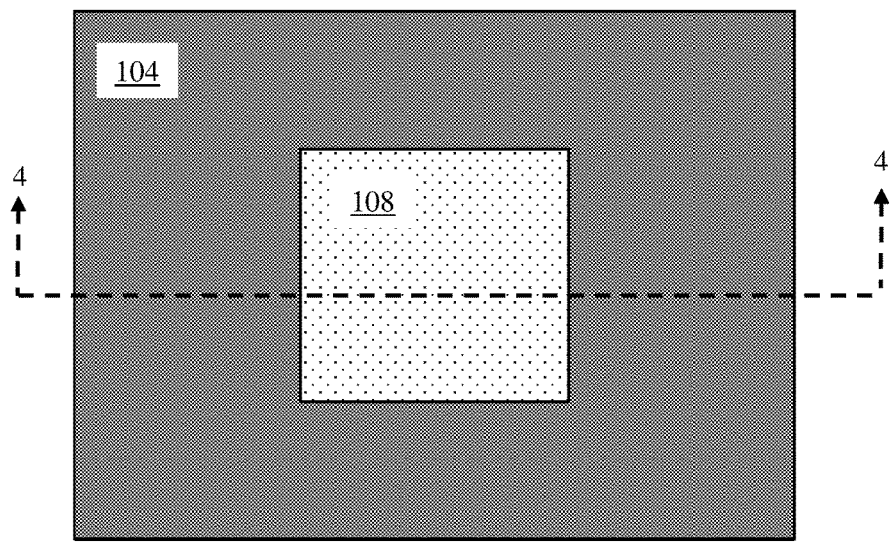
FIG. 3 provides a plan view of a semiconductor mandrel formed from the semiconductor substrate according to the disclosure.
Figure 4:
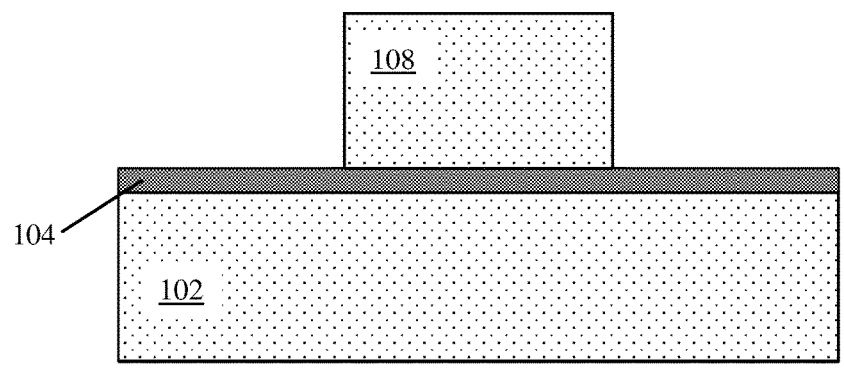
FIG. 4 provides a cross-sectional view of the semiconductor mandrel according to the disclosure.

Turning to FIGS. 3-4, with FIG. 4 providing a cross-sectional view of the structure line 4-4 in FIG. 3, forming a vertical FinFET according to the disclosure includes forming a semiconductor mandrel 108 from sacrificial semiconductor layer 106. After mandrel mask 107 (FIGS. 1-2) is formed on sacrificial semiconductor layer 106, portions of sacrificial semiconductor layer 106 not covered by mandrel mask 107 may be etched. Sacrificial semiconductor layer 106 may be etched by any currently known or later developed etchant configured to remove a semiconductor material without affecting the composition of mandrel mask 107, or substrate mask 104 after portions of sacrificial semiconductor material 106 located above substrate mask 104 have been removed. Etching portions of sacrificial semiconductor material 106 not covered by mandrel mask 107 may cause a remaining portion of sacrificial semiconductor material 106 to become a semiconductor mandrel 108 overlying only part of substrate mask 104. After the etching to form semiconductor mandrel 108 concludes, mandrel mask 107 may be removed (e.g., by stripping and/or other processes appropriate for removing a masking material) to uncover semiconductor mandrel 108. Portions of substrate mask 104 may remain below semiconductor mandrel 108 and above substrate 102 after the etching.

Figure 5:
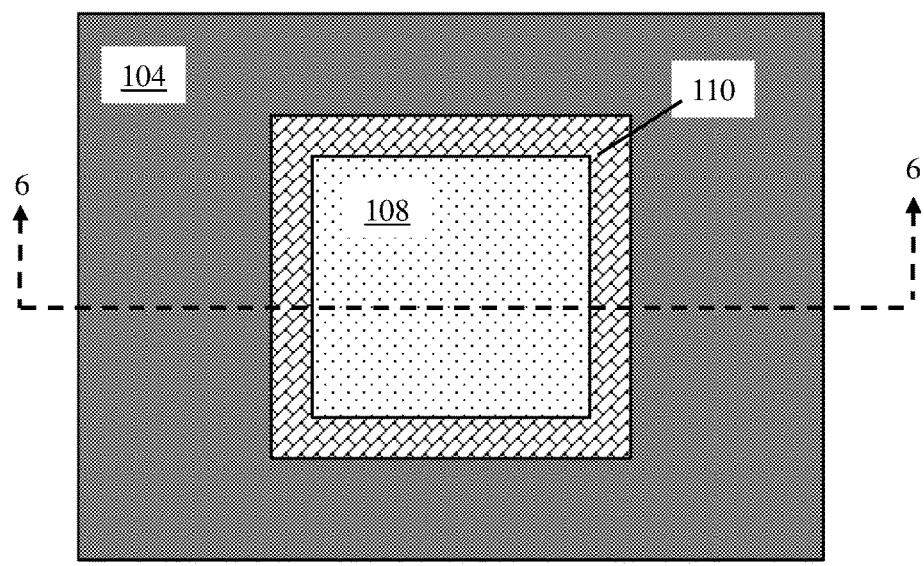
FIG. 5 provides a plan view of a channel region mask formed along an outer perimeter of the semiconductor mandrel according to the disclosure.
Figure 6:
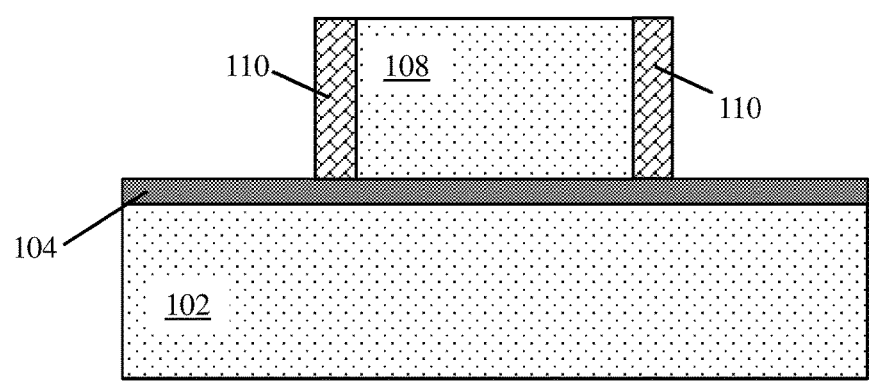
FIG. 6 provides a cross-sectional view of the channel region mask and semiconductor mandrel according to the disclosure.

Referring now to FIGS. 5-6, with FIG. 6 providing a cross-sectional view of the structure line 6-6 in FIG. 5, semiconductor mandrel 108 may be used as the formation site of a mask for a vertical FinFET channel region. To create a looping shape on the top of substrate mask 104, a layer of masking material may be conformally deposited on the upper surface and sidewalls of semiconductor mandrel 108, with a portion of the deposited material covering substrate mask 104 next to semiconductor mandrel 108. Portions of the masking material positioned on the upper surface of semiconductor mandrel 108 may then be etched away, e.g., by anisotropic etching, to yield a sidewall spacer 110 positioned completely along the sidewalls of the outer perimeter of semiconductor mandrel 108. Sidewall spacer 110 thus may be formed to surround the outer perimeter of semiconductor mandrel 108, with semiconductor mandrel 108 abutting the inner perimeter of sidewall spacer 110 without other materials being interposed between these two structures. Although semiconductor mandrel 108 and sidewall spacer 110 are shown by example to have substantially rectangular profiles, it is understood that these components may have substantially circular, rectangular, and/or other geometries. Sidewall spacer 110 may be formed from any currently known or later developed spacer material capable of being conformally deposited on a semiconductor without being selectively deposited on substrate mask 104. Sidewall spacer 110 may alternatively one or more masking materials included in the composition of mandrel mask 107 (FIGS. 1-2) but not included in substrate mask 104. Sidewall spacer 110 may surround semiconductor mandrel 108 on substrate mask 104. Substrate mask 104 may be positioned vertically between substrate 102 and the overlying portions of semiconductor mandrel 108 and sidewall spacer 110 after sidewall spacer 110 is formed.

Figure 7:
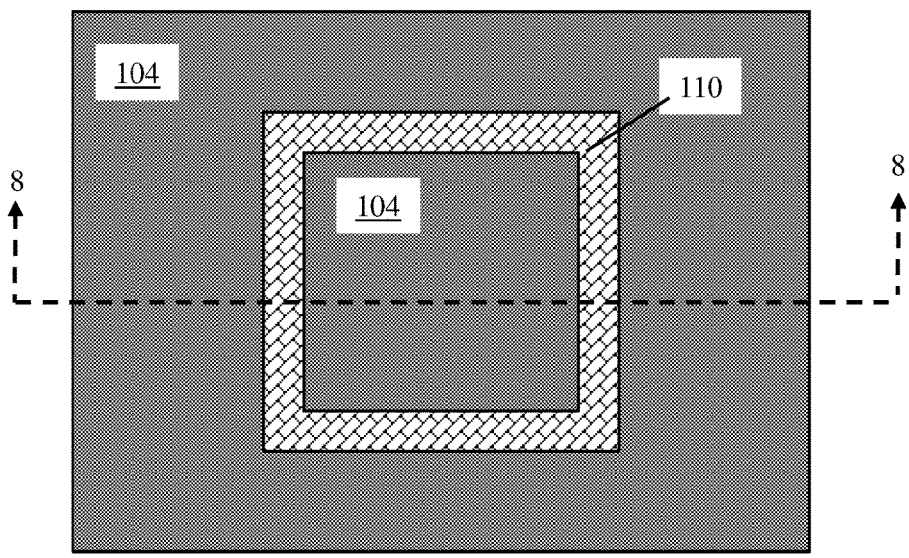
FIG. 7 provides a plan view of the channel region mask with the semiconductor mandrel removed according to the disclosure.
Figure 8:
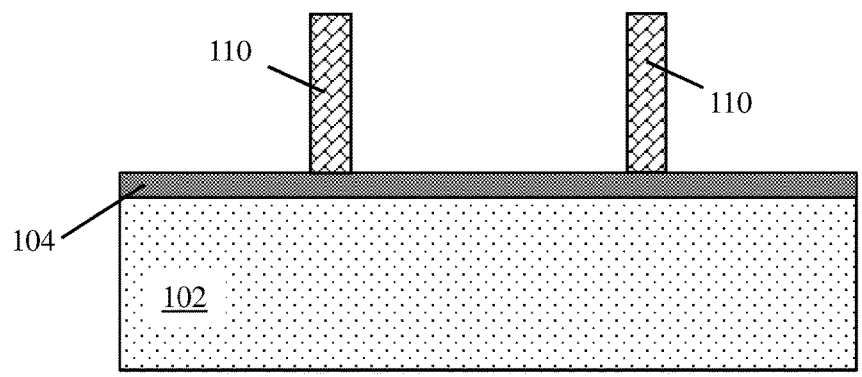
FIG. 8 provides a cross-sectional view of the channel region mask with the semiconductor mandrel removed according to the disclosure.

Turning now to FIGS. 7-8, with FIG. 8 providing a cross-sectional view of the structure line 8-8 in FIG. 7, semiconductor mandrel 108 (FIGS. 3-6) may be removed to create the hollow interior profile of a looped channel region formed in subsequent processes. Semiconductor mandrel 108 may be removed by way of an etchant selective to semiconductor materials. Removing semiconductor mandrel 108 may expose portions of substrate mask 104 which were previously positioned below semiconductor mandrel 108. Sidewall spacer 110 may remain intact on substrate mask 104 after semiconductor mandrel 108 is removed, e.g., as a result of removing semiconductor mandrel 108 with an etchant selective to semiconductor materials. Sidewall spacer 110 may have a looped structure and thus surround a portion of substrate mask 104.

Figure 9:
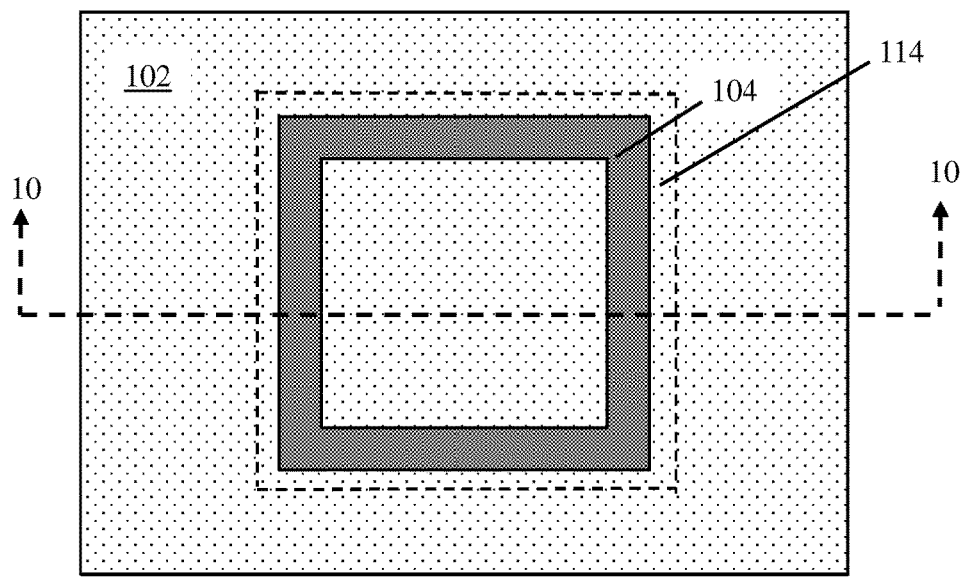
FIG. 9 provides a plan view of a looped channel region formed according to the disclosure.
Figure 10:
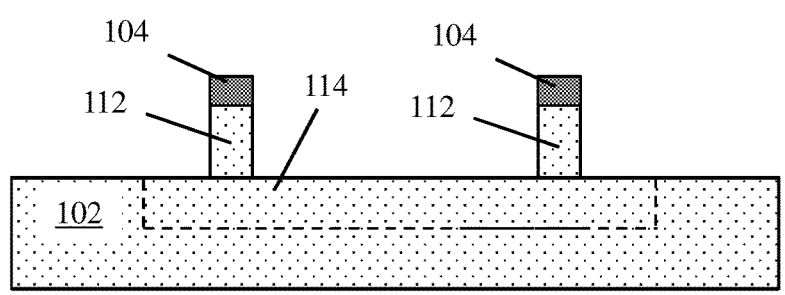
FIG. 10 provides a cross-sectional view of the looped channel region according to the disclosure.

Referring to FIGS. 9-10, with FIG. 10 providing a cross-sectional view of the structure line 10-10 in FIG. 9, the disclosure may include removing portions of substrate mask 104 not covered by sidewall spacer 110 (FIGS. 5-8), and portions of substrate 102 positioned below the removed portions of substrate mask 104. With sidewall spacer 110 in place, a vertical directional etching may remove the regions of substrate mask 104 not covered by sidewall spacer 110.

The amount of etching (e.g., the time of etching and/or amount of etching materials used) may be controlled to remove portions of substrate 102 to a desired depth. After the etching concludes, sidewall spacer 110 may be removed by stripping and/or other techniques appropriate for removing a masking material from the top of a structure. Removing portions of substrate mask 104 and underlying portions of substrate 102 may form a looped channel region 112 as a non-etched region of semiconductor material previously included in substrate 102. Although one looped channel region 112 is shown for the purposes of example, it is understood that any number of looped channel regions 112 (e.g., one, five, one hundred, one thousand or more channel regions, etc.) may be formed together by etching substrate mask 104 and substrate 102 according to the techniques provided herein. The embodiments described herein are thus operable for defining looped channel region 112 for a single vertical FinFET or multiple looped channel regions 112 for multiple vertical FinFETs. In any case, a portion of substrate mask 104 may remain intact on looped channel region 112 as a result of being previously covered by sidewall spacer 110.

After looped channel region 112 is created, portions of substrate 102 may be processed to form a first source/drain region 114. First source/drain region 114 may be distinguished from other portions of substrate 102 by having dopants therein, which may be introduced by way of ion implantation and/or other currently known or later developed processes of forming a source/drain region. In some cases, first source/drain region 114 may be formed by being previously doped and/or having dopants added thereto in a subsequent process structurally distinct from the remainder of substrate 102. In any case, first source/drain region 114 may occupy a larger surface area within substrate 102 than the surface area of looped channel region 112.

Figure 11:
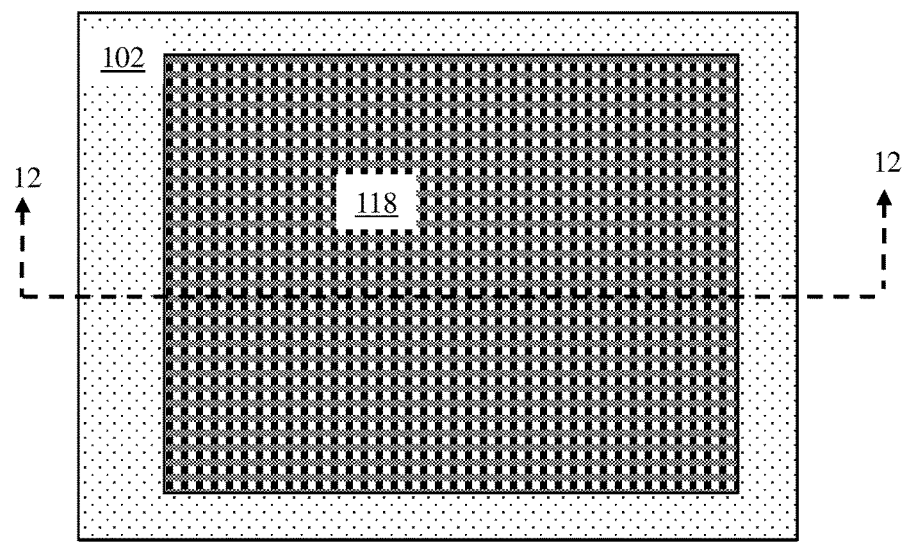
FIG. 11 provides a plan view of a trench mask and photoresist being formed on the substrate according to the disclosure.
Figure 12:
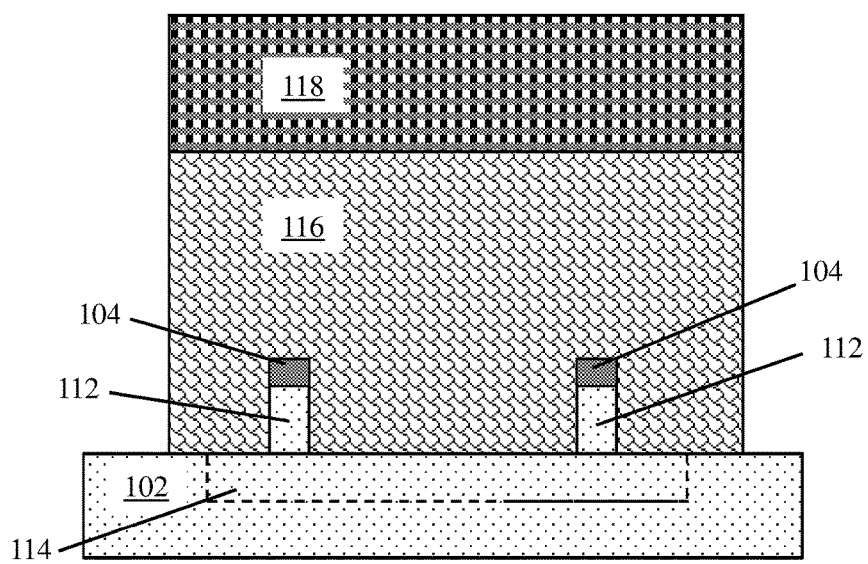
FIG. 12 provides a cross-sectional view of the trench mask and photoresist on the substrate according to embodiments of the disclosure.

The next group of processing techniques described herein may be create and form isolation regions between neighboring transistor structures. Turning to FIGS. 11-12, with FIG. 12 providing a cross-sectional view of the structure line 12-12 in FIG. 11, sets of masking material may be formed on substrate 102 to cover looped channel region 112 and the remaining portion of substrate mask 104. A masking layer 116 formed from, e.g., a nitride or otherwise masking material resistant to etching and different from the material used for substrate mask 104, may overlie substrate 102 within a predetermined surface area. Masking layer 116 may also be sized to have a vertical height above substrate 102 greater than the combined vertical height of looped channel region 112 and substrate mask 104 on substrate 102. Masking layer 116 may therefore cover looped channel region 112 and substrate mask 104 to protect looped channel region 112 and substrate mask 104 from being etched while masking layer 116 is in place. Masking layer 116 may initially be deposited as a single layer of material on substrate 102 before being patterned to cover a predetermined surface area.

Masking layer 116 may be formed with the aid of a photoresist layer 118. The term "photoresist layer" or "photoresist material," as used herein, refers to any currently known or later developed photo-sensitive material used in photolithography to transfer a pattern from a mask onto a wafer. Photoresist materials may include liquids deposited on the surface of the wafer as a thin film, which is then solidified by low temperature anneal. Photoresist layer 118 may be used to pattern masking layer 116 from an initial layer of material, in order to create areas of substrate 102 where trench isolations and/or other portions of a device structure may be formed without affecting looped channel region 112. In still further alternatives, masking layer 116 and photoresist layer 118 may be substituted for a single layer of masking material. Where applicable, photoresist layer 118 may be removed (e.g., by stripping) to uncover masking layer 116 after masking layer 116 has been processed.

Figure 13:
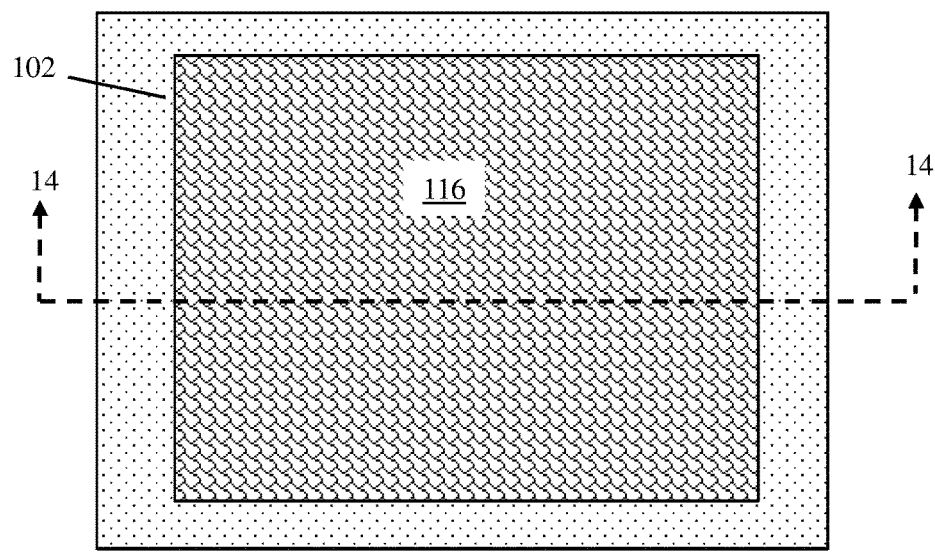
FIG. 13 provides a plan view of trenches being formed in the substrate according to the disclosure.
Figure 14:
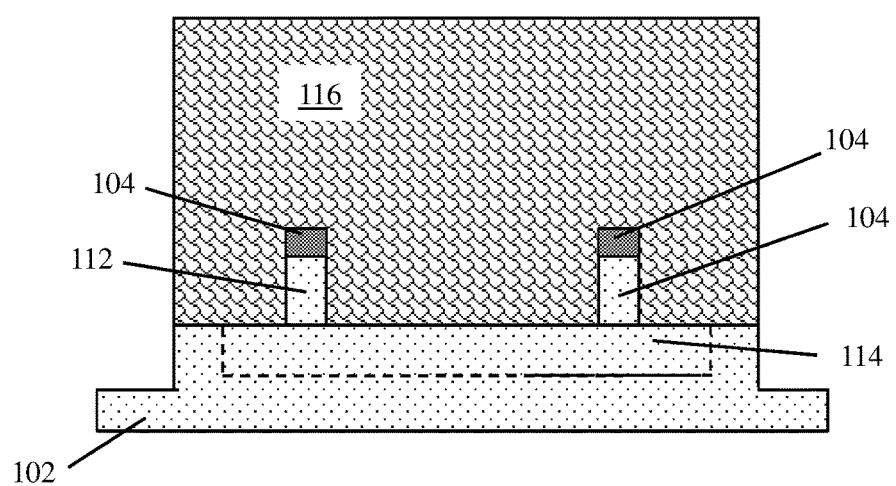
FIG. 14 provides a cross-sectional view of the trenches within the substrate according to embodiments of the disclosure.

Referring now to FIGS. 13-14, with FIG. 14 providing a cross-sectional view of the structure line 14-14 in FIG. 13, substrate 102 may be processed to create additional portions of a vertical FinFET structure while masking layer 116 remains in place and covers looped channel region 112 and substrate mask 104. As noted above, masking layer 116 may be shaped to leave selected portions of substrate 102 uncovered. The uncovered portions of substrate 102 may be vertically etched to recess the upper surface of substrate 102 laterally outside masking layer 116. The etching of substrate 102 at this phase may leave at least some of substrate 102 intact. The portions of substrate 102 covered by masking layer 116 will not be etched or otherwise modified during the vertical etching. The non-etched portions of substrate 102 below masking layer 116 may include first source/drain region 114.

Figure 15:
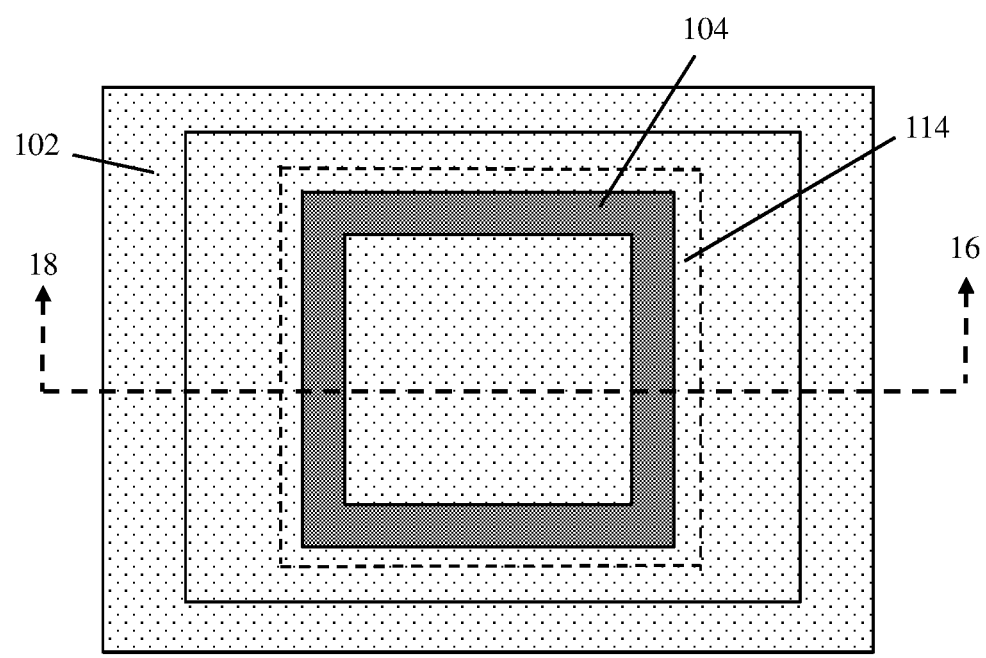
FIG. 15 provides a plan view of the trench mask being removed according to embodiments of the disclosure.
Figure 16:
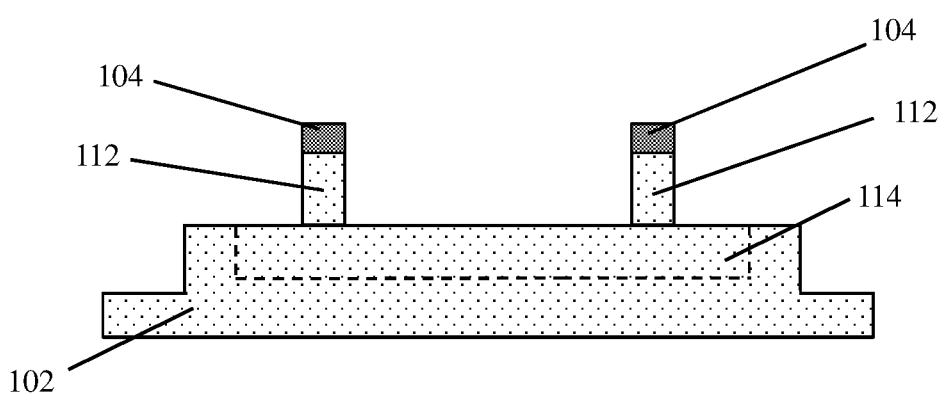
FIG. 16 provides a cross-sectional view of the structure with the trench mask removed according to embodiments of the disclosure.

Proceeding to FIGS. 15-16, with FIG. 16 providing a cross-sectional view of the structure line 16-16 in FIG. 15, the etched regions of substrate 102 not covered by masking layer 116 may determine locations for isolating a vertical FinFET transistor from neighboring transistors and/or other structures. To begin the process of creating isolation regions between transistor structures on substrate 102, masking layer 116 (FIGS. 12-14) may be stripped away to uncover first source/drain region 114, along with looped channel region 112 positioned on first source/drain region 114, and substrate mask 104 positioned on looped channel region 112. Masking layer 116 may be removed by stripping and/or any other process for removing combinations of masking material (e.g., hard masks and soft masks). One such methodology for removing masking layer 116 may include ashing. Ashing generally refers to the selective removal of insulating and/or organic elements by volatilization, e.g., by using one or more strongly oxidizing ambient materials or techniques (e.g., oxygen plasma ashing).

Figure 17:
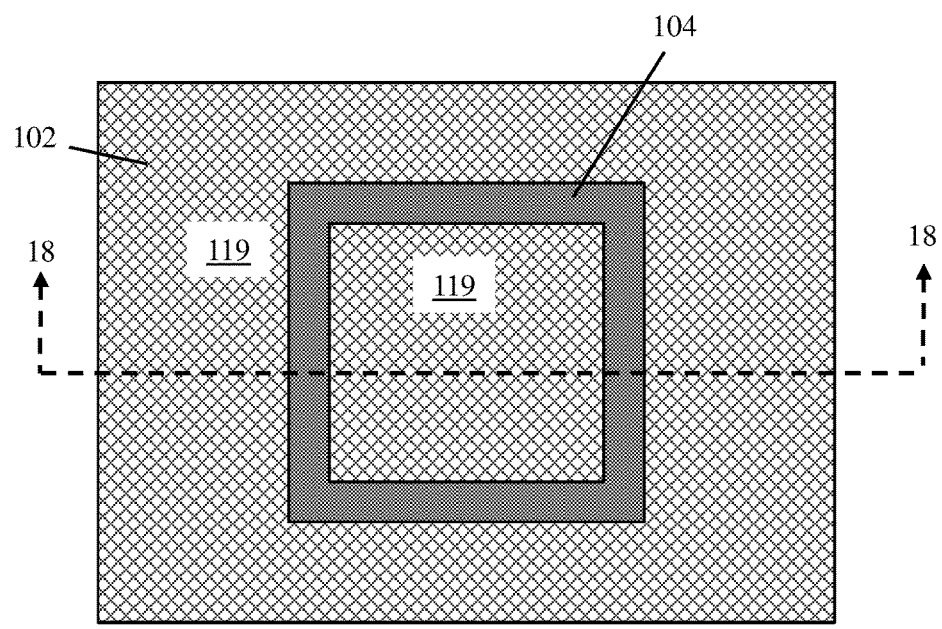
FIG. 17 provides a plan view of depositing an insulator according to embodiments of the disclosure.
Figure 18:
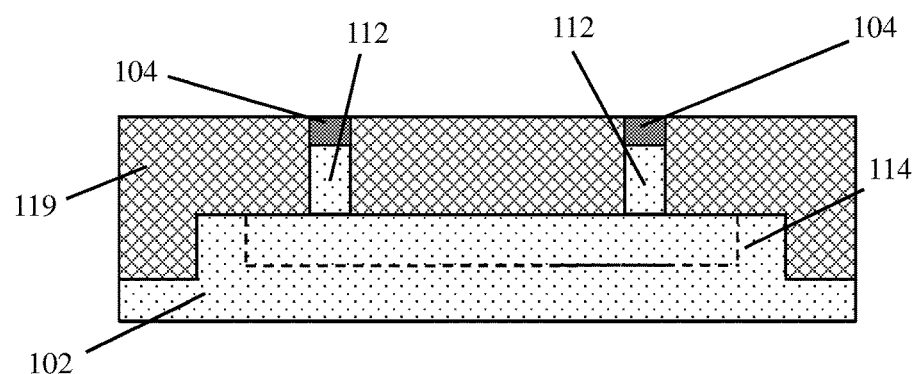
FIG. 18 provides a cross-sectional view of the insulator deposited on the structure according to embodiments of the disclosure.

Referring now to FIGS. 17-18, with FIG. 18 providing a cross-sectional view of the structure line 18-18 in FIG. 17, a first step of forming isolation regions between neighboring transistor structures on substrate 102 is shown. After masking layer 116 is removed, an insulator 119 may be deposited on the exposed surfaces of substrate 102 and first source/drain region 114 to cover looped channel region 112 and the remaining portions of substrate mask 104. Insulator 119 may initially have an upper surface positioned above substrate mask 104, before being planarized (e.g., by way of chemical mechanical planarization (CMP)) such that the top surface of insulator 119 above substrate 102 is substantially coplanar with the top surface of substrate mask 104 above substrate 102. The composition of insulator 119 may include, e.g., silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties. Other materials and/or components described herein as having electrically insulating properties may similarly include one or more of these example materials.

Figure 19:
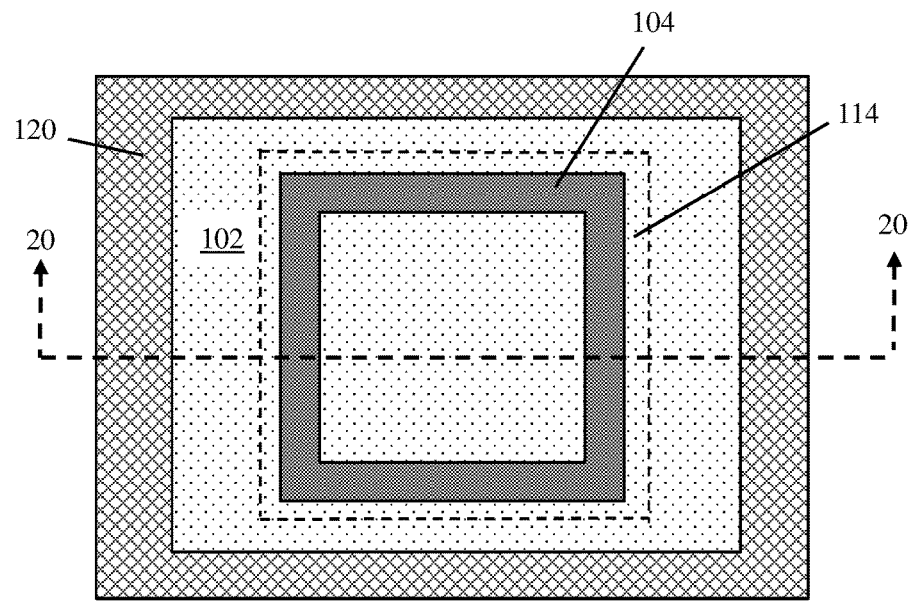
FIG. 19 provides a plan view of forming shallow trench isolations (STIs) from the insulator according to embodiments of the disclosure.
Figure 20:
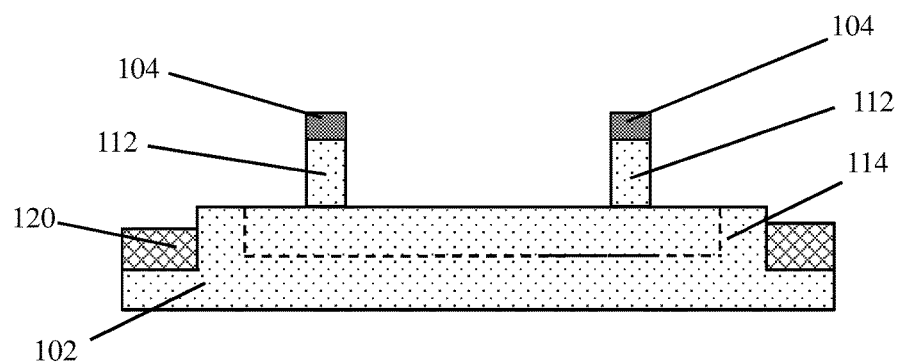
FIG. 20 provides a cross-sectional view of the structure with STIs according to embodiments of the disclosure.

Referring now to FIGS. 19-20, with FIG. 20 providing a cross-sectional view of the structure line 20-20 in FIG. 19, the deposited insulator 119 (FIGS. 17-18) may be processed to form one or more shallow trench isolations (STIs) 120. STI(s) 120 may be formed from insulator 119, and alongside first source/drain region 114, by applying a timed selective etch of insulator 119 such that looped channel region 112, substrate mask 104 on looped channel region 112, and first source/drain region 114 remain substantially intact during the etching of insulator 119. STI(s) 120 may alternatively be positioned directly alongside the outer perimeter of first source/drain region 114 in some embodiments. The type of etchants used and/or the time period of etching may be selected such that STI(s) 120 are created on the upper surface of substrate 120, and alongside the vertical sidewalls of first source/drain region 114, while being absent from the upper surface of source/drain region 114. Device fabrication may then proceed with forming the remaining portions of a vertical FinFET after STI(s) 120 have been formed on substrate 102.

Figure 21:
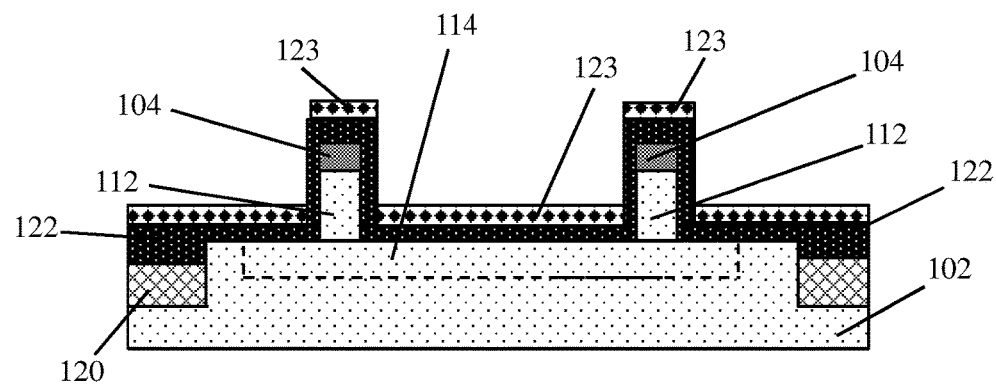
FIG. 21 provides a cross-sectional view of forming a first spacer and masking region according to embodiments of the disclosure.

The remaining steps to form a vertical FinFET according to the disclosure are shown in the accompanying FIGS. 21-24 solely by cross-sectional views from along the same perspective shown in FIG. 20. Referring to FIG. 21, embodiments of the disclosure may include conformally depositing a first spacer 122 on first source drain region 114, the sidewalls of looped channel region 112, the sidewalls and upper surface of substrate mask 104, and STI(s) 120. First spacer 122 may include one or more electrically insulating materials, e.g., one or more oxide or nitride insulators, configured to separate the source and/or drain of a transistor from nearby portions of a transistor gate. First spacer 122 may be formed by being conformally deposited on substrate mask 104, looped channel region 112, first source/drain region 114, and STI(s) 120. CVD, in particular, may be a deposition process appropriate to form first spacer 122 on the upper surface and/or sidewalls of these components. After initially being formed, first spacer 122 may be etched, planarized, etc., to occupy a smaller surface area as discussed herein.

Figure 22:
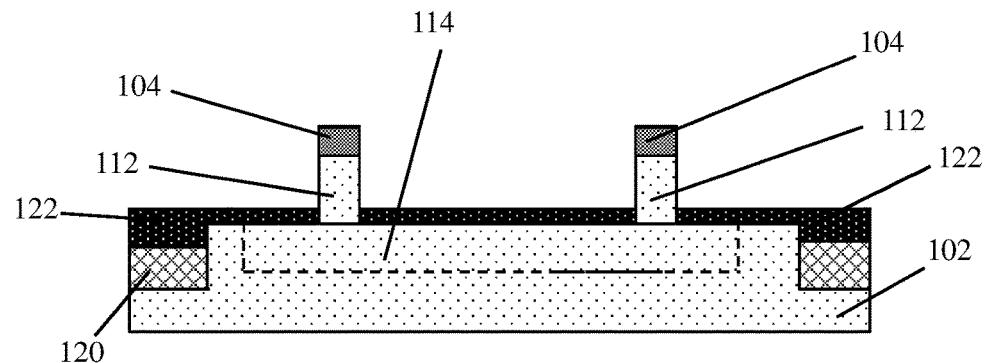
FIG. 22 provides a cross-sectional view of removing portions of the first spacer according to embodiments of the disclosure.

Referring to FIGS. 21-22 together, portions of first spacer 122 may be removed to allow subsequent formation of transistor elements on looped channel region 112. To facilitate processing of looped channel region 112, the disclosure may include forming a surface mask 123 (FIG. 21 only) on selected surfaces of first spacer 122 laterally adjacent to looped channel region 112. Surface mask 123 may be deposited by forming an organic planarizing layer (OPL) or similar material via spin on deposition, i.e., a process used to deposit uniform thin films on a flat surface. The deposited OPL can then be etched back to expose sidewall surfaces of first spacer 122 on looped channel region 112. The amount of deposited material may be controlled such that surface mask 123 is positioned on first spacer 122 laterally alongside looped channel region 112. The use of non-conformal deposition may also cause surface mask 123 to cover portions of first spacer 122 positioned on the top of substrate mask 104, and overlying looped channel region 112. Surface mask 123 may not be present on portions of first spacer 122 which coat the sidewalls of looped channel region 112 and substrate mask 104 due to the use of non-conformal deposition. To remove first spacer 122 from the sidewalls of looped channel region 112, the method may include non-selectively etching portions of first spacer 122 not covered by surface mask 123, thereby removing first spacer 122 from at least the sidewalls of looped channel region 112 and substrate mask 104. Surface mask 123 may be removed (e.g., by stripping) after the etching concludes. FIG. 21 depicts the structure before etching occurs, and FIG. 22 depicts the structure after targeted portions of first spacer 122 have been etched away, and after the removal of surface mask 123. The etching may, in some cases, also reduce the size of looped channel region 112 and portions of substrate mask 104 positioned on looped channel region 112. A remainder of first spacer 122 may remain intact over STI(s) 120 and first source/drain region 114, such that first spacer 122 is laterally adjacent to looped channel region 112 along its inner and outer perimeters.

Figure 23:
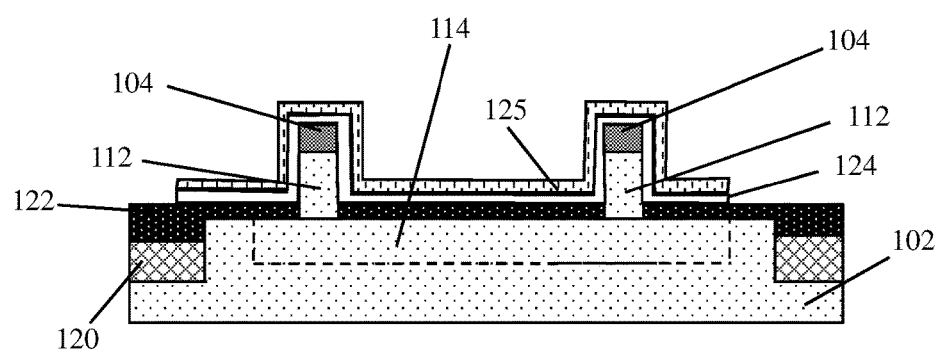
FIG. 23 provides a cross-sectional view of conformally depositing a gate dielectric and gate region according to embodiments of the disclosure.

Turning to FIG. 23, further processing may yield the components of one or more gates of a vertical FinFET transistor. First, a thin gate dielectric layer 124 may be formed covering looped channel region 112. Gate dielectric layer 124 may substantially mimic the geometrical profile of looped channel region 112, substrate mask 104, and where applicable, first spacer 122 as a result of being conformally deposited on the upper surfaces and sidewalls of these materials. Gate dielectric layer 124 may be composed insulating material such as $SiO_2$ or a "high-k" dielectric material having a high dielectric constant, e.g., above 3.9.

After depositing gate dielectric layer 124, a gate region 125 may be formed on portions of gate dielectric layer 124 to form the remaining portions of a gate structure. Gate region 125 may be conformally deposited on gate dielectric layer 124 inside the interior perimeter of looped channel region 112, over looped channel region 112, and alongside the outer perimeter of looped channel region 112. Gate region 125 may include, e.g., any combination of conducting materials (e.g., metal, doped polycrystalline silicon, etc.) for providing an electrostatic coupling to looped channel region 112. As discussed below, gate region 125 may be structurally modified to create independent gate regions of a single transistor, each of which may be configured to affect the electrical conductivity of looped channel region 112 by the application of voltages to the gate region(s).

Figure 24:
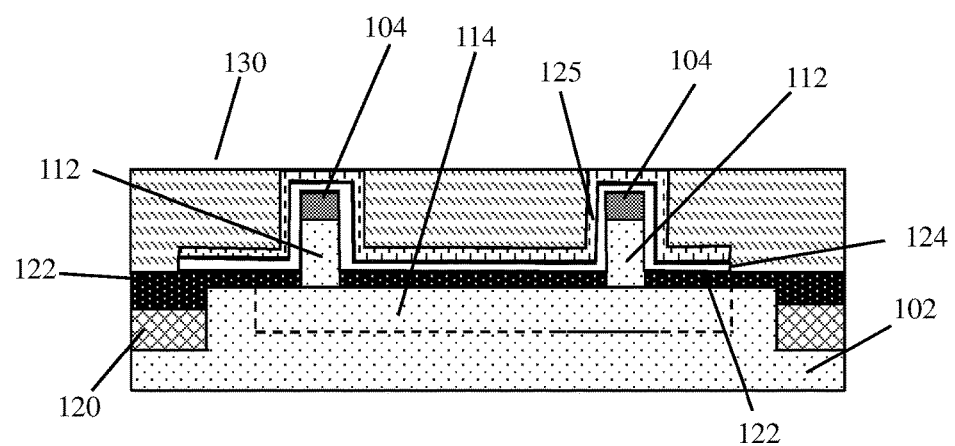
FIG. 24 provides a cross-sectional view of forming and planarizing an inter-level dielectric (ILD) according to embodiments of the disclosure.

Referring now to FIG. 24, the disclosure may include forming an additional region of insulating materials to separate the vertical FinFET materials from overlying materials and/or structures. An inter-level dielectric material (ILD) 130 may be formed to initially cover the formed precursor gate material 125, such that other underlying elements below these materials are also covered by ILD 130. ILD 130 may include one or more layers, films, etc., of dielectric material appropriate for structurally separating distinct layers of an IC structure, and to form a barrier to subsequently formed vertical FinFETs. ILD 130 may initially be formed on the exposed surfaces to a height above the top surface of gate region 125, thereby causing ILD 130 to initially cover gate region 125 and each structural element covered by gate region 125. ILD 130 may then be planarized by way of chemical mechanical polishing (CMP) or a similar process such that the top surface of ILD 130 is substantially coplanar with an upper surface of gate region 125. The upper surface of gate region 125 that is substantially coplanar with the top of ILD 130 may be positioned over gate dielectric layer 124 above looped channel region 112 and substrate mask 104.

Figure 25:
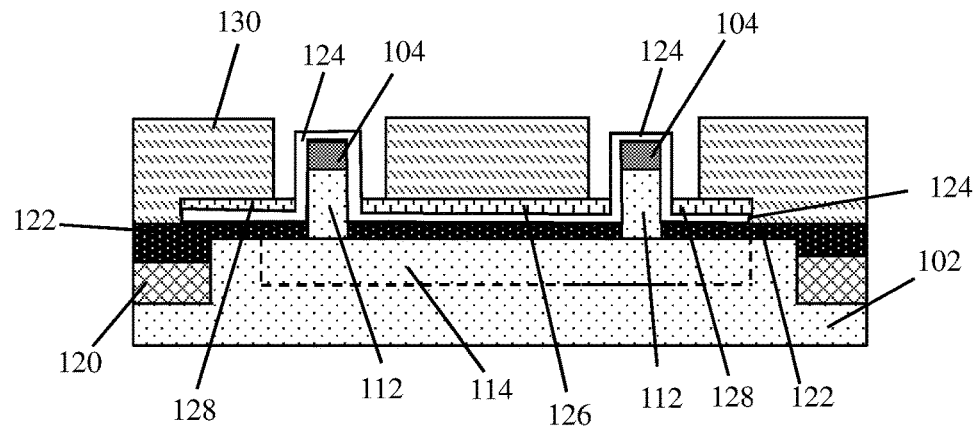
FIG. 25 provides a cross-sectional view of etching the gate region to form openings in the ILD according to embodiments of the disclosure.

Turning to FIG. 25, portions of gate region 125 may be etched to prepare for the subsequent formation of additional source/drain regions. A selective etch of gate region 125 may remove portions of gate region 125 without affecting ILD 130, and to a depth controlled by the etch time. The etching discussed above may form a first gate 126 surrounded by looped channel region 112 and a second gate 128 surrounding looped channel region 112, from gate region 125. First gate 126 thus may be structurally independent from second gate 128 after the etching concludes. Applying a predetermined voltage to first gate 126 (e.g., an electrical potential equal to or greater than a threshold value), may selectively render looped channel region 112 electrically conductive or non-conductive to affect the operation of a device. A different remaining portion of gate region 125, after the etching, may provide the structure of second gate 128. Second gate 128 may independently affect the conductivity of looped channel region 112 by having voltages applied thereto.

Figure 26:
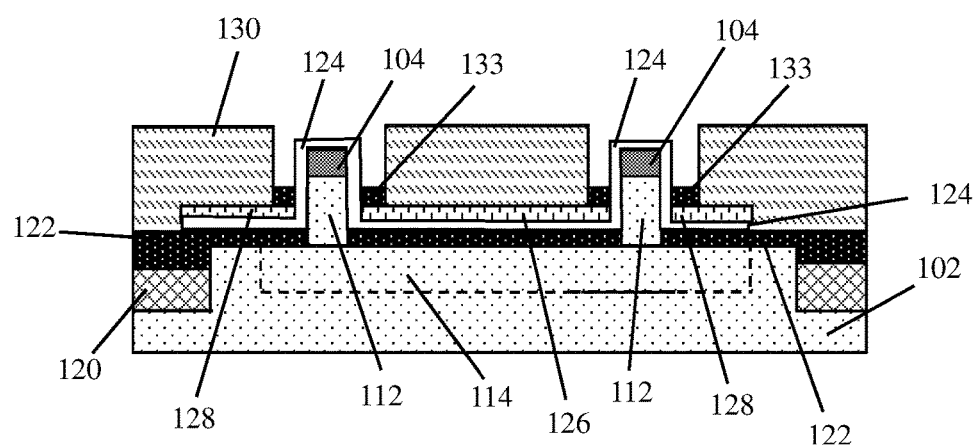
FIG. 26 provides a cross-sectional view of forming a second pacer on the gate dielectric according to embodiments of the disclosure.

Referring now to FIG. 26, the disclosure may include forming a second spacer 133 on first and/or second gates 126, 128 by substantially the same processes used to form first spacer 122. Second spacer 133, more specifically, can be formed by conformally depositing spacer material on gates 126, 128, looped channel region 112, and overlying portions of ILD 130, forming a surface mask (composed of, e.g., an OPL material), etching away portions of the surface mask which remain on the sidewalls of ILD 130, and then removing the surface mask. Second spacer 133 may have a same or similar material composition as first spacer 122. Second spacer 133 may structurally separate first and second gates 126, 128 from materials formed on or above looped channel region 112. Spacer 133 can be formed before any epitaxial growth on looped channel region 112 to ensure that epitaxially grown materials are not formed on, or in close proximity to, gates 126, 128.

Figure 27:
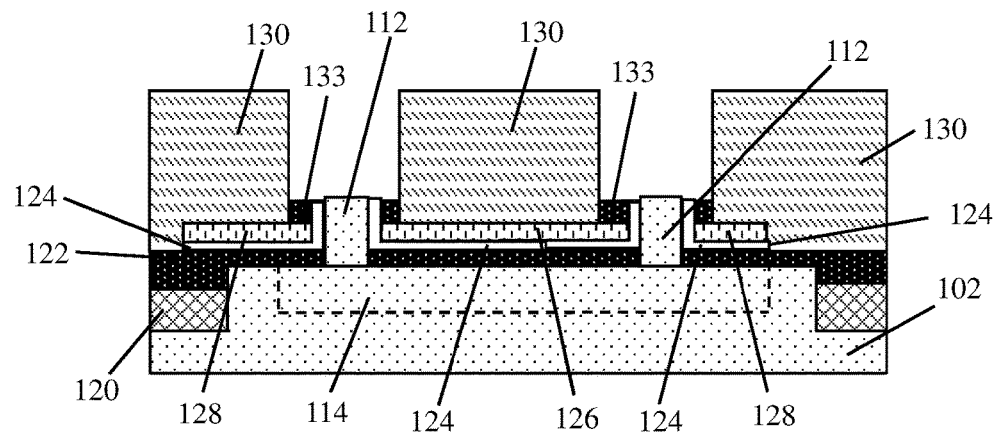
FIG. 27 provides a cross-sectional view of removing portions of the gate dielectric to form first and second gate regions according to embodiments of the disclosure.

Referring to FIG. 27, continued processing of the structure may reveal portions of looped channel region 112 previously covered by gate dielectric 124. After second spacer 133 is formed, gate dielectric 124 and substrate mask 104 can be selectively etched for a predetermined amount of time or with a predetermined amount of selective etchants, thereby removing these materials from the structure. The use of a selective etchant may leave ILD 130 and second spacer 133 substantially intact after the etching. As shown, etching away portions of gate dielectric 124 and substrate mask 104 can uncover looped channel region 112.

Figure 28:
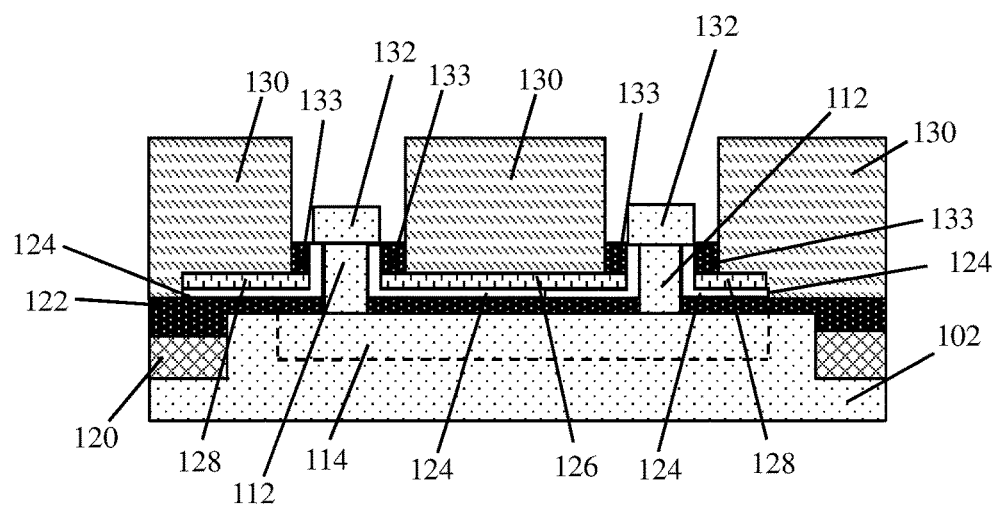
FIG. 28 provides a cross-sectional view of epitaxially growing a second source/drain region on the looped channel region according to embodiments of the disclosure.

Turning to FIG. 28, the disclosure may include epitaxially growing additional semiconductor material on the exposed top surface of looped channel region 112 to form additional source/drain regions. The terms "epitaxial growth and/or deposition" and "epitaxially formed and/or grown" mean the growth of a semiconductor material on a deposition surface of a semiconductor material, also known as a "seed layer," in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces. Epitaxially growing second source/drain region 132 from looped channel region 112 may cause the second source/drain region to have a larger cross-sectional volume than the underlying portion of looped channel region 112. Second source/drain region 132 thus may cover portions of gate dielectric layer 124 positioned alongside looped channel region 112 after being formed. After second source/drain region 132 has been formed, the removed portions of ILD 130 may be replaced with new insulative material, e.g., after one or more electrical contacts are formed to second source/drain region 132.

Figure 29:
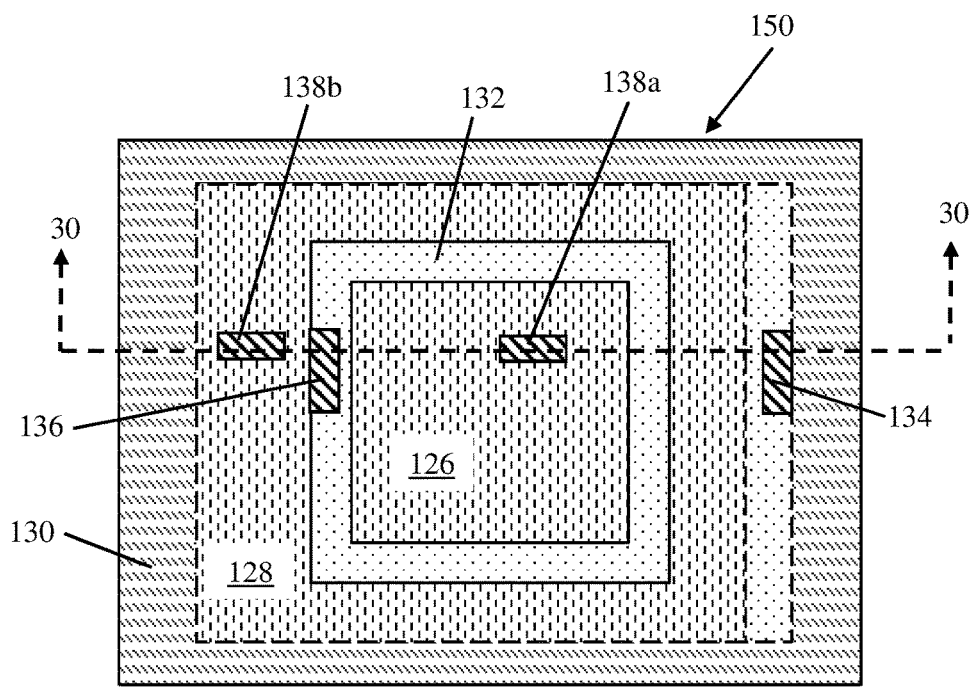
FIG. 29 provides a plan view of forming source/drain and gate contacts according to embodiments of the disclosure.
Figure 30:
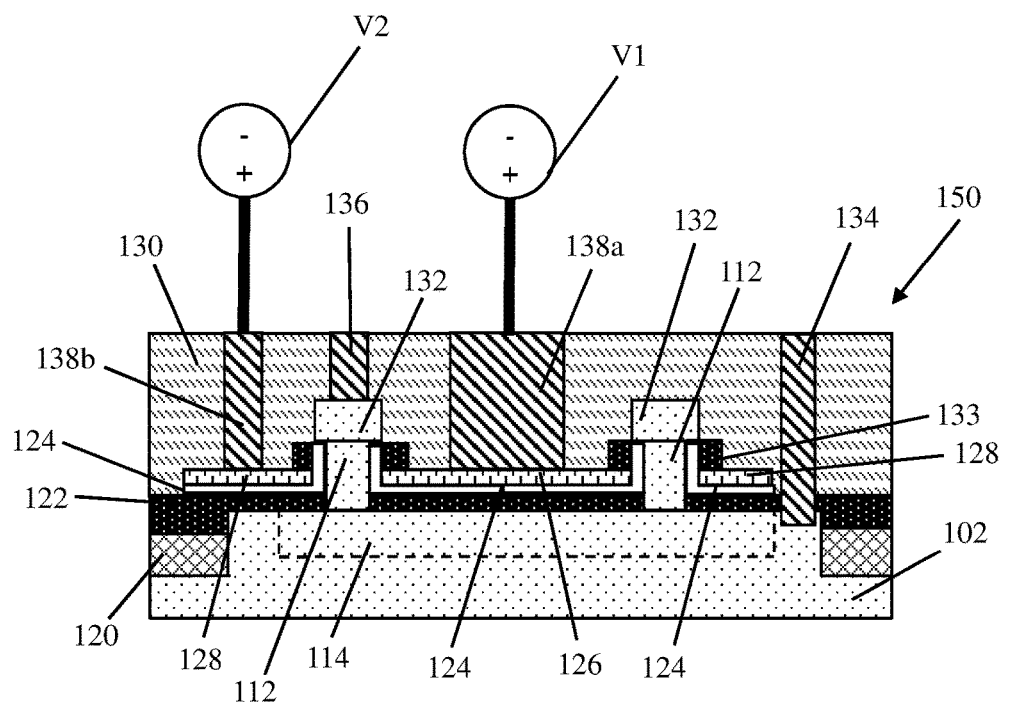
FIG. 30 provides a cross-sectional view of a vertical FinFET according to embodiments of the disclosure.

Turning now to FIGS. 29-30, a vertical FinFET 150 according to embodiments of the disclosure is shown, with FIG. 30 providing a cross-sectional view of vertical FinFET 150 along line 30-30 in FIG. 29. The plan view of FIG. 29 illustrates portions of vertical FinFET 150 beneath ILD 130 in dashed lines to better illustrate each component where a transistor contact is formed. Contacts to various portions of vertical FinFET 150 may be formed by depositing an additional mask (not shown) on predetermined portions of FinFET 150 while leaving other materials uncovered, applying a controlled amount of vertical etching to form openings to one or more contact sites, and then filling the openings with a conductor. Vertical FinFET 150 may include, e.g., a first source/drain contact 134 extending from, e.g., the top of ILD 130, to first source/drain region 114, and a second source/drain contact 136 extending from, e.g., the top of ILD 130, to second source/drain region 132. One or more gate contacts 138a, 138b may extend from, e.g., the top of ILD 130, through the body of ILD 130, to land on first gate 126 or second gate 128. As shown, first gate contact 138a may connect a first voltage source V1 to first gate 126. Second gate contact 138b may connect a second voltage source V2 to second gate 128. First voltage source V1 and second voltage source V2 may be independent from each other, allowing for independent gate control of vertical FinFET 150 through first gate 126 or second gate 128. Some horizontally-extending portions of gate dielectric layer 124 may remain intact beneath first and/or second gate 126, 128, as a result of prior conformal deposition. However, vertical portions of gate dielectric layer 124 coating the vertical sidewalls of looped channel region 112 may serve as gate dielectric regions during the operation of vertical FinFET 150, regardless of whether horizontally-extending portions of gate dielectric layer 124 remain intact.

Vertical FinFET 150 may include structural features directly related to the processing techniques discussed herein, and related operational advantages. Vertical FinFET 150 may include substrate 102 with first source/drain region 114 therein. Substrate 102 may also be positioned laterally adjacent to STI(s) 120 to separate vertical FinFET 150 from neighboring structures. Looped channel region 112 may be positioned on and overlie the upper surface of first source/drain region 114, thereby defining a hollow interior located laterally within the interior perimeter of looped channel region 114. The sidewall-to-sidewall lateral width of first gate 126 within looped channel region 112 may be up to approximately forty nanometers (nm) to provide a compact device architecture as compared to conventional transistor structures. First source/drain contact 134 may provide an electrical connection to first source/drain region 114, e.g., nearby or through a portion of substrate 102.

First gate 126 may be formed onto looped channel region 112 along its inner perimeter, such that first gate 126 is positioned within the hollow interior of looped channel region 112. Second gate 128 may be formed onto looped channel region 112 outside the outer perimeter of looped channel region 112. Looped channel region 112 thus may be directly interposed between first and second gates 126, 128. Gate contacts 138a, 138b may provide respective electrical connections from external voltage sources (e.g., V1, V2) to first and second gates 126, 128. Each gate 126, 128 may include a conductive material separated from underlying and adjacent materials by portions of gate dielectric layer 124 as discussed elsewhere herein. Second source/drain region 132 may be positioned on at least part of the upper surface of looped channel region 112, with second source/drain contact 136 providing an electrical connection to second source/drain region 132.

Where applicable, vertical FinFET 150 may include first spacer 122 over first and second gates 126, 128. As a result of being processed according to the techniques described above, first spacer 122 may be positioned on an upper surface of substrate 102 and/or first source/drain region 114, such that first gate 126 is positioned over first spacer 122. Second spacer 133 may also be included in vertical FinFET 150 as discussed herein, e.g., by being positioned on an upper surface of first gate 126 and laterally adjacent to the inner perimeter of looped channel region 122. Second spacer 133 may be substantially coplanar with the upper surface of looped channel region 122, such that second source/drain region 132 is positioned over second spacer 133 in addition to looped channel region 112.

Before proceeding to discussion of subsequent processing techniques, structures, and accompanying FIGS., it is noted that that the various techniques described herein relative to one or more or FIGS. 1-30 may be applied and depicted together in one of FIGS. 31-43, and that the various processing techniques described herein may be combined and/or substituted where appropriate without departing from the underlying technical concepts and characteristics of the present disclosure. It is again emphasized that the processes discussed herein and shown in the accompanying FIGS. 1-43 reflect a similar or identical set of processing concepts with possible variances in implementation, discussed herein.

Figure 31:
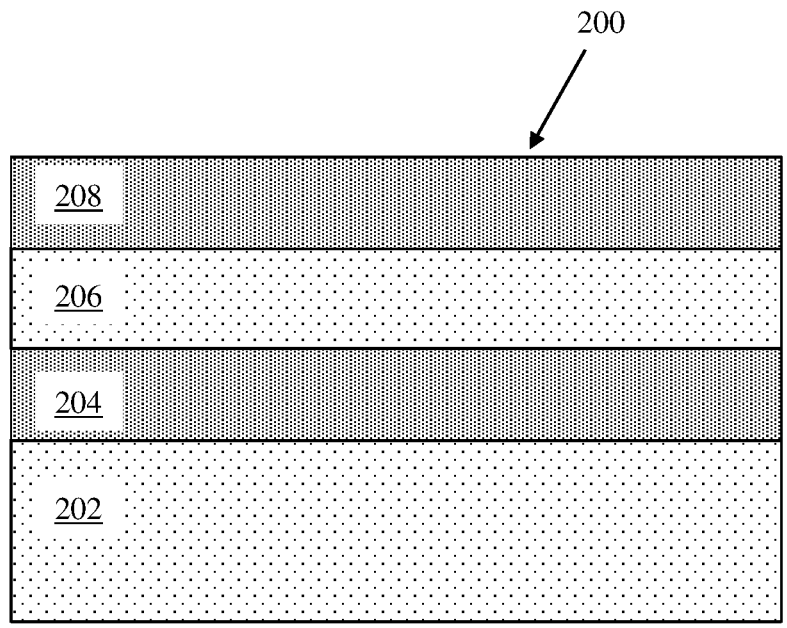
FIG. 31 provides a cross-sectional view of a precursor structure to be processed according to further embodiments of the disclosure.

Referring to FIG. 31, a modified precursor structure 200 is shown to illustrate further methodologies to form a vertical FinFET structure according to the disclosure. Precursor structure 200 may include, e.g., a substrate 202, a first source/drain region 204 positioned directly on substrate 202, a channel material 206 positioned directly on first source/drain region 204, and a precursor source/drain region 208 positioned directly on channel material 206. First source/drain region 204 may be left substantially intact to form one source/drain region of a vertical FinFET as discussed in the processes below, while channel material 206 and precursor source/drain region 208 will be modified from their original form to yield a device structure according to the disclosure. Each separately identified layer 202, 204, 206, 208 may be provided as a layer of semiconductor material similar or identical to that of substrate 102 (FIGS. 1-30), with source/drain regions 204, 208 having a greater or otherwise different concentration of dopants than the semiconductor material of substrate 202 and/or channel material 206.

Figure 32:
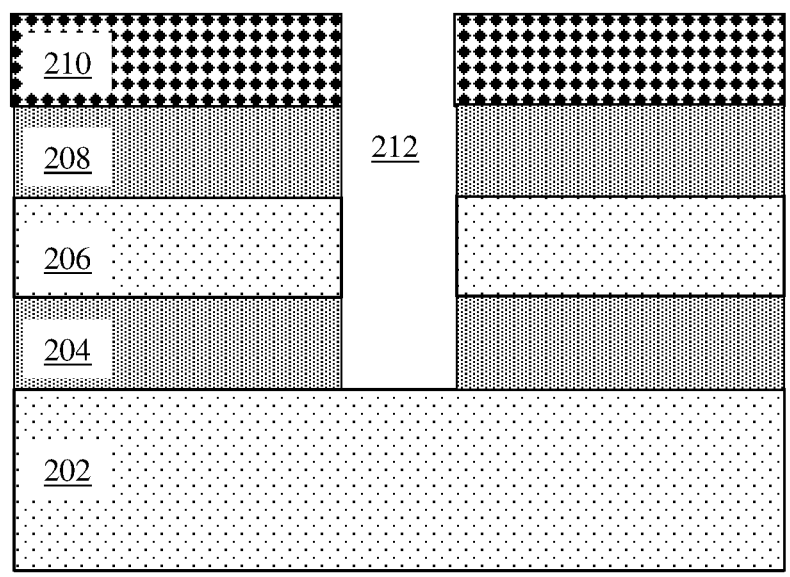
FIG. 32 provides a cross-sectional view of masking the precursor structure and forming a cavity according to the disclosure.

Turning to FIG. 32, portions of precursor structure 200 may be targeted and processed to create various regions of a vertical FinFET structure. An initial mask 210 including, e.g., one or more nitride and/or oxide insulators, may be positioned on the top surface of precursor source/drain region 208. Initial mask 210 may be formed on selected portions of precursor source/drain region 208 while leaving other portions of precursor source/drain region 208 uncovered. The uncovered portions of precursor source/drain region 208 may be selected to target and remove portions of material where a first gate will be positioned inside a looped channel region in a resulting vertical FinFET structure. Portions of precursor source/drain region 208, and underlying portions of channel material 206, and first source/drain region 204 may be vertically etched to expose the upper surface of substrate 202. The removed portions of material may thus create a cavity 212 surrounded by the remainder of first source/drain region 204. Cavity 212 may be shaped to have substantially the same geometrical profile and lateral width of subsequently formed gate materials to be surrounded by a looped channel region as discussed elsewhere herein.

Figure 33:
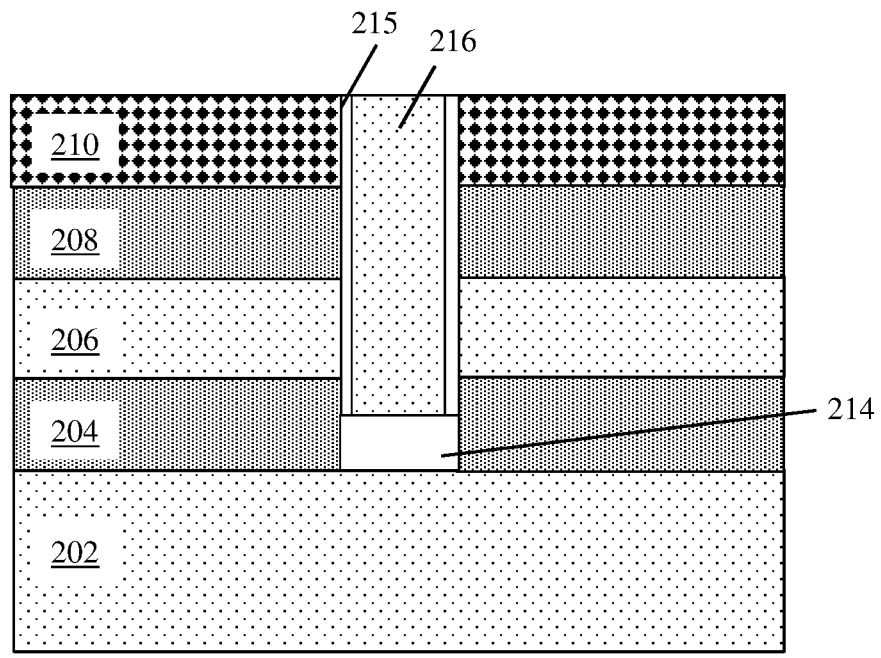
FIG. 33 provides a cross-sectional view of filling the cavity with an insulator region and sacrificial gate according to the disclosure.

Turning to FIG. 33, cavity 212 (FIG. 32) may be filled with precursor materials to create the structure of a gate of a vertical FinFET transistor. In a vertical FinFET transistor, a region of insulative material may help to electrically separate gate regions of the transistor from underlying semiconductor material. To form such a material, an insulator region 214 may be deposited within the interior of cavity 212 to line at least the top surface of substrate 202 within cavity 212. Insulator region 214 may include one or more of the example electrically insulating materials described above with respect to additional or alternative processing techniques, or may include a different electrically insulating material. The sidewalls of cavity 212 (i.e., the sidewall surfaces of source/drain regions 204, 208, channel material 206, and intermediate mask 210) may also be lined with an insulator liner 215 formed from the same material used to create insulator region 214, e.g., due to the use of conformal deposition to form insulator region 214. Insulator liners 215 may have a lower thickness than that of insulator region 214 positioned on substrate 202 at the bottom of cavity 212. After forming insulator region 214 and insulator liners 215, the remaining portions of cavity 212 may be filled with a sacrificial gate 216 composed of one or more semiconductor materials such as those included in the composition of substrate 202, channel material 206, or source/drain regions 204, 206. Portions of insulator region 214, insulator liners 215, and sacrificial gate 216 located above precursor source/drain region 208 may be used to create the position of spacer materials in subsequent processing of the structure.

Figure 34:
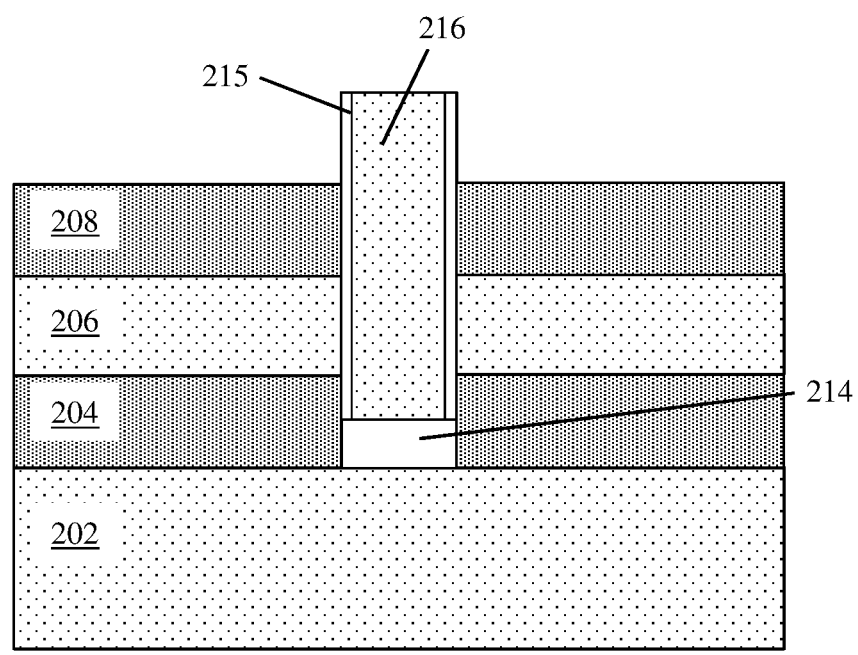
FIG. 34 provides a cross-sectional view of removing the mask from the precursor structure according to the disclosure.

Referring to FIG. 34, intermediate mask 210 may be removed to uncover precursor source/drain region 208, in addition to exposing portions of insulator liners 215 and sacrificial gate 216 located above precursor source/drain region 208. Intermediate mask 210 may be removed by application of any currently known or later developed technique for removing a layer of masking material, e.g., stripping, ashing, and/or other processes for removing a mask from a material without affecting other structures.

Figure 35:
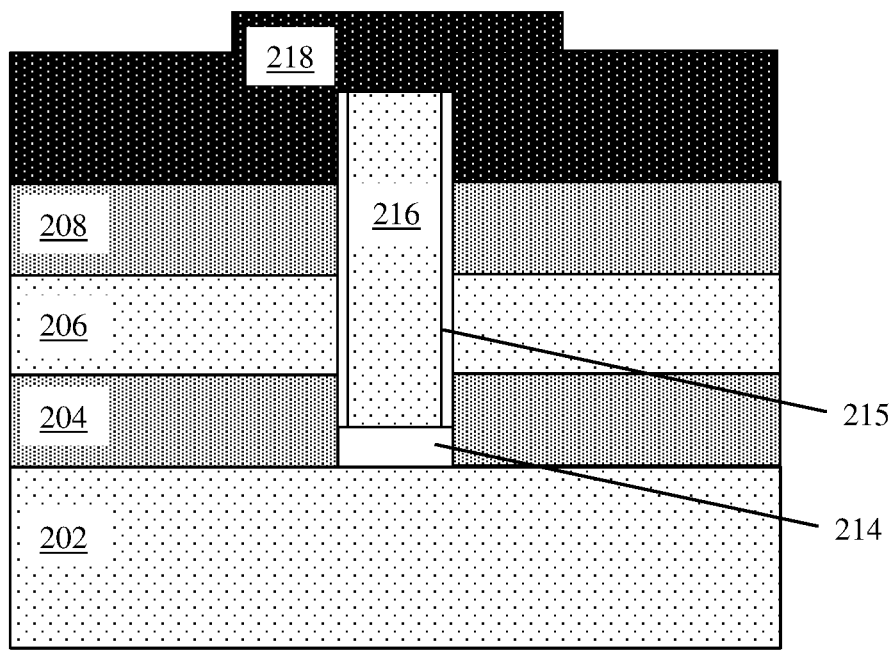
FIG. 35 provides a cross-sectional view of forming a spacer material on an upper surface and sidewalls of the insulator and first gate material according to the disclosure.

Turning to FIG. 35, additional processes may include forming and processing a spacer to yield the lateral width of underlying layers for a vertical FinFET. After removing intermediate mask 210 (FIGS. 32-33), a spacer material 218 may be deposited on the upper surface of precursor source/drain region 208, sidewalls of insulator region 214, and the upper surfaces of insulator region 214 and sacrificial gate 216. The deposited spacer material 218 may include any currently known or later developed insulative structure capable of being blanket deposited on uncovered surfaces, e.g., a nitride or oxide insulator. Spacer material 218 may initially cover the entirety of precursor source/drain region 208, insulator region 214, insulator liners 215, and sacrificial gate 216. After being formed, spacer material 218 may subsequently be processed to yield the thickness of source/drain and channel regions in a vertical FinFET.

Figure 36:
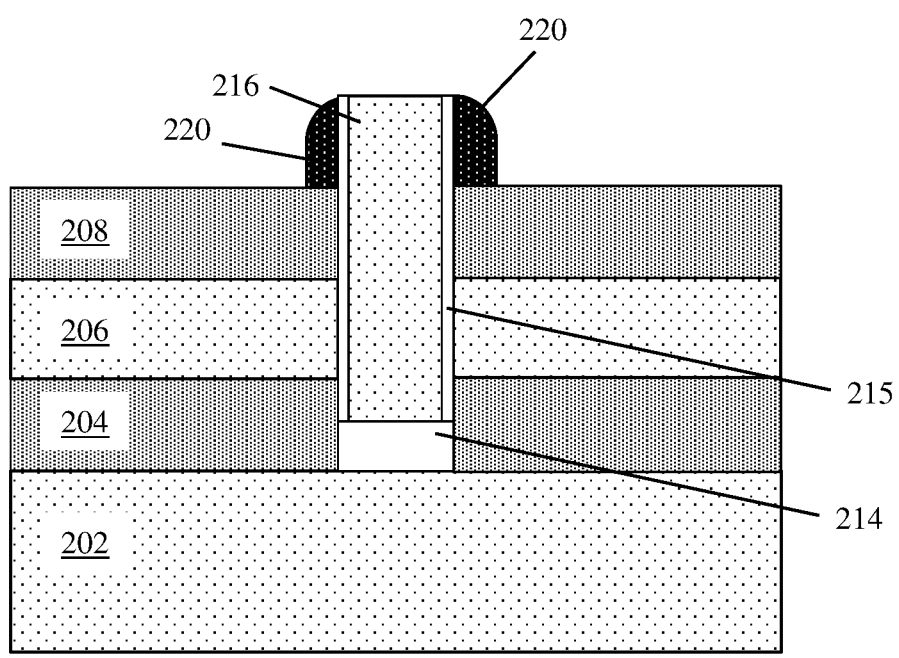
FIG. 36 provides a cross-sectional view of etching the spacer material to form spacers according to the disclosure.

Referring now to FIG. 36, the further processing to form a vertical FinFET may include etching portions of spacer material 218 to leave at least one spacer 220 intact substantially along vertical sidewalls of insulator liner 215. Though two regions are indicated as being spacers 220 in FIG. 36, these portions represent a single spacer 220 surrounding the outer perimeter of insulator liners 215. In alternative embodiments, it is understood that multiple spacer(s) 220 could be formed to accommodate non-rounded geometrical profiles. Spacer(s) 220 alongside insulator liners 215 may have a lateral thickness from the sidewall of insulator liners 215 determined by the amount of spacer material 218 previously formed and the amount of applied etchants. Spacer(s) 220 may shape the lateral thickness of source/drain and channel regions in a vertical FinFET by covering a portion of precursor source/drain region 208, which in turn covers portions of channel material 206, first source/drain region 204, and substrate 202.

Figure 37:
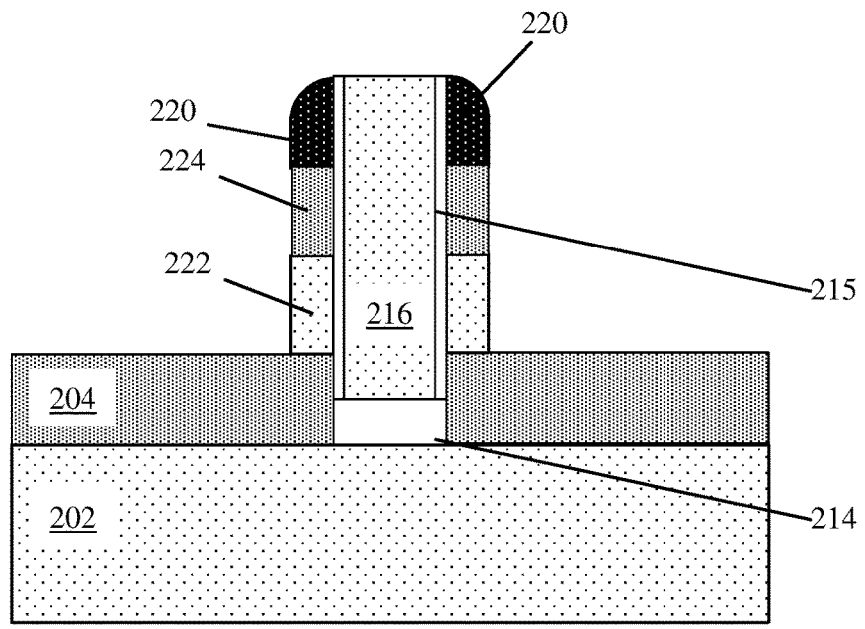
FIG. 37 provides a cross-sectional view of forming a first source/drain region, a looped channel region, and a second source/drain region according to the disclosure.

Turning to FIG. 37, subsequent processing of the structure may include vertically etching materials positioned laterally outside spacer 220 to expose underlying portions of first source/drain region 204. Before such etching begins, the upper surface of sacrificial gate 216 may be covered with another masking material (not shown) to allow vertical etching of precursor source/drain region 208 and underlying portions of channel material 206, in the same manner as other vertical etching processes described above and implemented with the aid of a mask. FIG. 37 illustrates the structure after the etching concludes and any masking material is removed from above sacrificial gate 216. After first source/drain region 204 is uncovered as a result of the etching, a remaining portion of channel material 206 may form a looped channel region 222 positioned directly on a portion of first source/drain region 204 and directly laterally adjacent to insulator liners 215. Similarly, a remaining portion of precursor source/drain region 208 may create a second source/drain region 224 positioned on top of looped channel region 222 and directly laterally adjacent to insulator liners 215. The lateral thickness and geometrical profile of looped channel region 222 and second source/drain region 224 may be determined by the size of spacer(s) 220 positioned above these materials. Although looped channel region 222 is described below and shown in FIG. 43 as having a substantially circular shape, looped channel region 222 could also be formed to have a substantially rectangular, triangular, and/or other looped geometrical profile by forming differently-shaped spacer(s) 220 and/or cavities 212.

Figure 38:
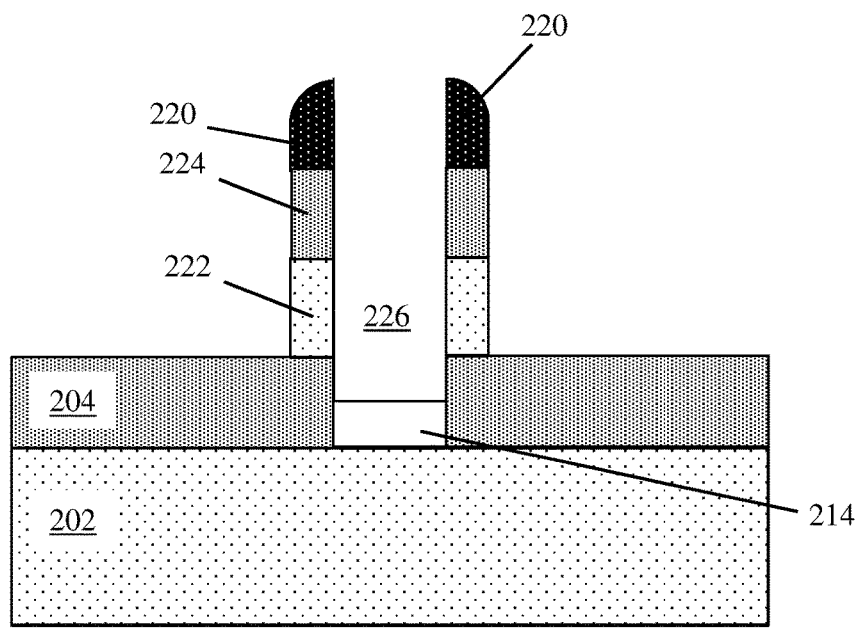
FIG. 38 provides a cross-sectional view of removing the sacrificial gate material according to the disclosure.

Proceeding to FIG. 38, the structure may be further prepared for subsequent formation of active gate structures. Sacrificial gate 216, in addition to portions of insulator liners 215 positioned along the outer perimeter of sacrificial gate 216, may be etched away to form a gate cavity 226. The forming of gate cavity 226 may be implemented by etching sacrificial gate 216 selectively, or with a mask in place outside the perimeter of spacers 220 to remove sacrificial gate 216 and portions of insulator liners 215 without significantly removing other materials. The amount etchant and/or the time period of etching may be controlled such that at least a portion of insulator region 214 remains intact at the bottom of gate cavity 226. Insulator region 214 thus may continue to cover substrate 202 within gate cavity 226. Removing sacrificial gate 216 may expose the inner perimeter of looped channel region 222 and second source/drain region 224. These processes may form a structure in which both looped channel region 222 and second source drain/region 224 exhibit a looped geometry, including exposed inner and outer perimeters. After gate cavity 226 is formed, the remaining spacer(s) 220 may continue to cover the top surface of second source/drain region 224.

Figure 39:
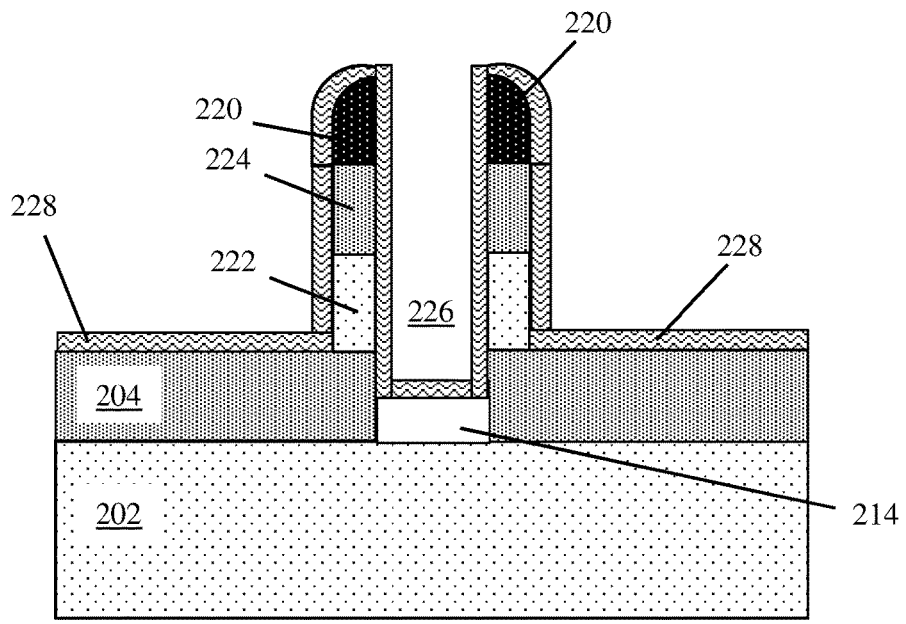
FIG. 39 provides a cross-sectional view of forming a conformal gate dielectric according to the disclosure.

FIG. 39 depicts a subsequent process of beginning to form first and second gates along the various surfaces of first source/drain region 204, looped channel region 222, and second source/drain region 224, in addition to portions of insulator region 214 and spacer(s) 220. As discussed above relative to gate dielectric layer 124 (FIGS. 27, 28, 29) of additional or alternative implementations, a gate structure may include a gate dielectric 228 to separate electrically conductive portions of the gate structure from nearby semiconductor portions of looped channel region 222. Gate dielectric 228 may be conformally deposited on the upper surfaces and sidewalls first source/drain region 204, looped channel region 222, and second source/drain region 224 to substantially mimic the geometrical profile of these materials. Gate dielectric 228 may be composed of any insulating material such as $SiO_2$ or a "high-k" dielectric having a high dielectric constant, which may be, for example, above 3.9. Gate dielectric 228 may also rest on an upper surface of insulator region 214 as well as the upper surface and sidewalls of spacer 220. Gate dielectric 228 marks the first portion of active first and second gate materials in a resulting vertical FinFET structure. Forming gate dielectric 228 by way of conformal deposition may cause at last part of gate cavity 226 to remain at least partially open and unfilled above portions of gate dielectric 228 formed on insulator region 214.

Figure 40:
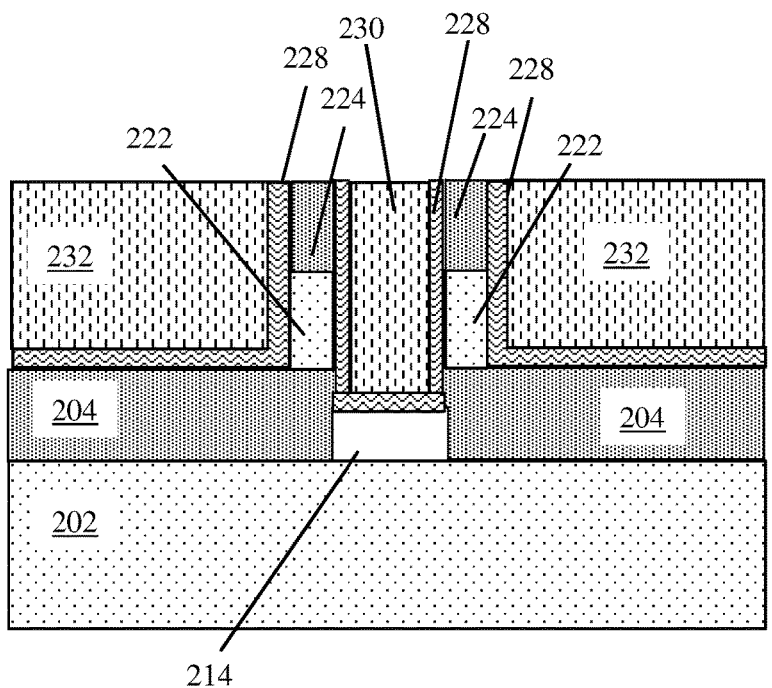
FIG. 40 provides a cross-sectional view of forming first and second gates and removing the spacers according to embodiments of the disclosure.

Turning to FIG. 40, continued processing of the structure may include forming the conductive regions of transistor gates and removing the remaining spacer(s) 220. As described above relative to other implementations, embodiments of the disclosure may include conformally depositing a single region of conductive or doped semiconductor material on the previously-formed gate dielectric 228 to form a precursor gate material for the vertical FinFET structure. The formed material may fill gate cavity 226, regions outside the outer perimeter of looped channel region 222, second source/drain region 224, and spacer(s) 220, and initially may extend above the top surface of spacers 220. The formed material may then be planarized (e.g., by chemical mechanical cleaning (CMC), with spacer(s) 220 being removed in the same process, to yield a first gate 230 and a second gate 232. Since spacer(s) 220 were formed during manufacture of the structure to determine the width of looped channel region 222 and source/drain region 224 between their inner and outer perimeters. At the processing stages to form gate dielectric 228, first gate 230, and second gate 232, spacer(s) 220 may not serve a further use for processing and/or operation of a device. As noted above, spacer(s) 220 may be removed by application of CMC to uncover the top surface of second source/drain region 224.

The remaining portion of material within gate cavity 226 (FIGS. 38-39) may create first gate 230. First gate 230 thus may be surrounded by gate dielectric 228 over insulator region 214. Together, gate dielectric 228 and first gate 230 may create one gate region of the vertical FinFET transistor, surrounded by and laterally abutting the inner perimeters of looped channel region 222 and second source/drain region 224. In addition to first gate 230, portions of gate material positioned outside the outer perimeter of looped channel region 222 and second source/drain region 224 may create a second gate 232 to the vertical FinFET transistor structure. Although second gate 232 is shown in two locations, it is understood that these two locations provide portions of one second gate 232 which wrap around and laterally abut gate dielectric 228 at the outer perimeter of looped channel region 222 and second source/drain region 224. Although the upper surfaces of first gate 230 and second gate 232 may be substantially coplanar with each other, the vertical height of first gate 232 above insulator region 214 may be greater than the vertical height of first gate 230 above first source/drain region 204. Where applicable, differences in height between each gate 230, 232 derives from second gate 232 being formed on gate dielectric 228 over first source/drain region 204, while first gate 230 is formed on gate dielectric 228 over insulator region 214. These physical characteristics may indicate that vertical FinFET 250 was fabricated by methods according to the present disclosure, rather than by other processing techniques.

Figure 41:
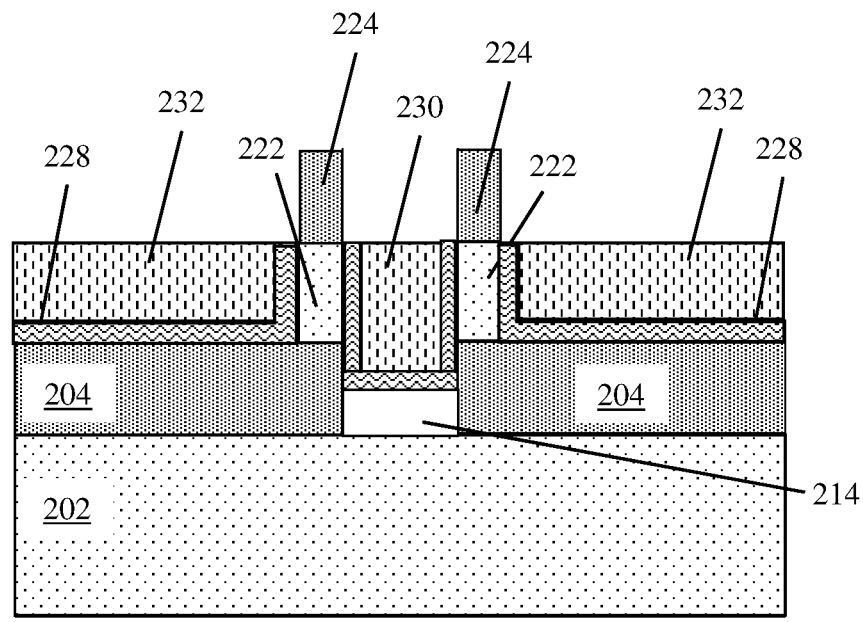
FIG. 41 provides a cross-sectional view of vertically recessing the gates and gate dielectric to uncover an upper surface and sidewalls of the second source/drain region according to embodiments of the disclosure.

Referring to FIG. 41, vertical FinFET structures may have improved operation when gate materials are not positioned in close proximity with second source/drain region 224. Subsequent processing of the structure may remove portions of gate dielectric 228 and gates 230, 232 to control the gate length and leave second source/drain region 224 free of physical and/or electrical contact with gate dielectric 228 and gates 230, 232. The material composition of gates 230, 232 and corresponding portions of gate dielectric 228 may be etched away, e.g., by a selective etching of conductive and/or insulating materials while leaving the doped semiconductor composition of second source/drain region 224 substantially intact. After removing these portions of gate dielectric 228 and gates 230, 232, the upper surface of gates 230, 232 and gate dielectric 228 may be substantially coplanar with the upper surface of looped channel region 222. Second source/drain region 224 may thus exhibit a looped structure having approximately the same profile as looped channel region 222 without laterally abutting gate dielectric 228 along its outer or inner perimeters. Subsequent processing may provide electrical contact(s) to second source/drain region 224 and further insulating second source/drain region 224 from other materials.

Figure 42:
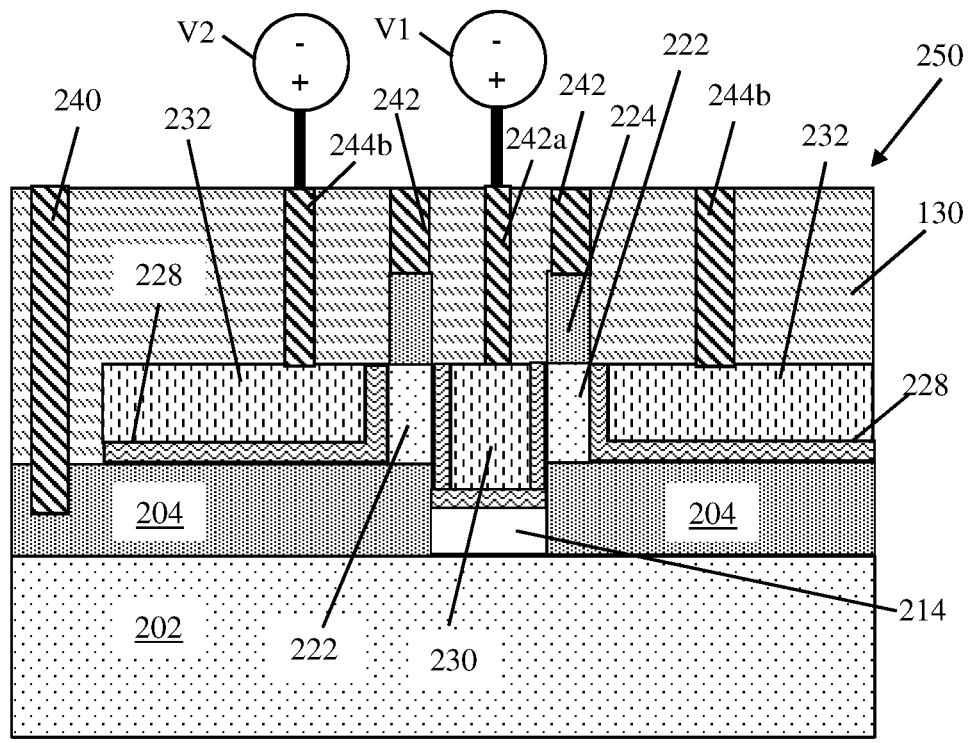
FIG. 42 provides a cross-sectional view of a vertical FinFET according to embodiments of the disclosure.
Figure 43:
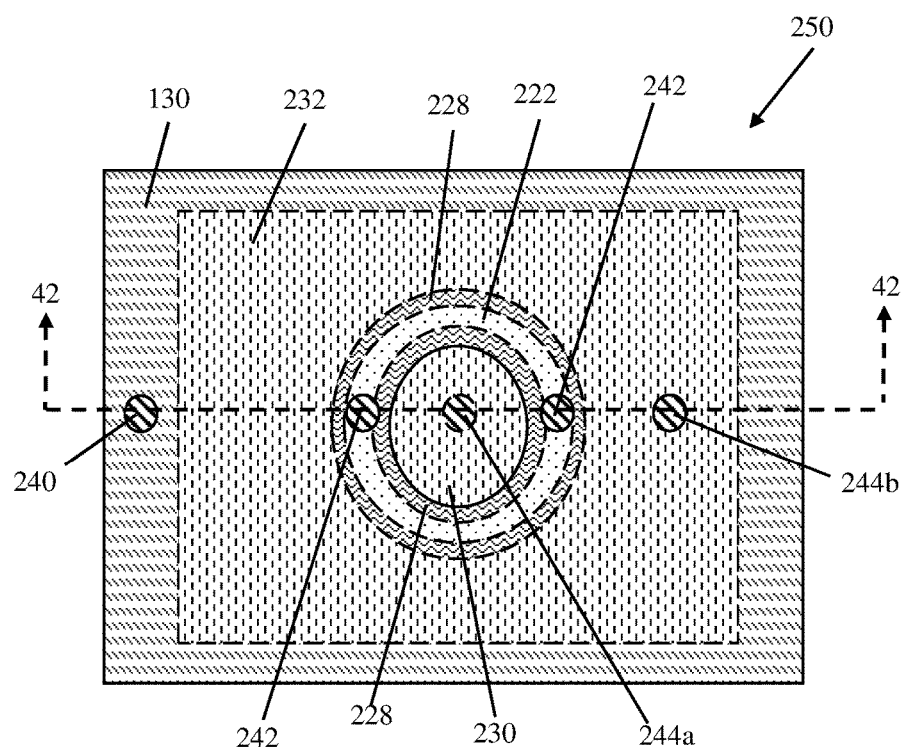
FIG. 43 provides a plan view of a vertical FinFET according to embodiments of the disclosure.

Referring to FIGS. 42-43 together, a vertical FinFET 250 according to the disclosure is shown, with FIG. 42 showing a cross-sectional view of structure 250 along line 42-42 of FIG. 43. As discussed elsewhere herein, ILD 130 may be formed over the various other components (e.g., source/drain regions 204, 224, insulator region 214, etc.) to electrically insulate vertical FinFET 250 from overlying materials and structures. The plan view of FIG. 43 illustrates portions of vertical FinFET 250 beneath ILD 130 in dashed lines to better illustrate each component where each transistor contact is formed. Contacts to various portions of vertical FinFET 250 may be formed by depositing an additional mask (not shown) on predetermined portions of ILD 130 while leaving other materials uncovered, applying a controlled amount of vertical etching to form openings to one or more contact sites, and then filling the openings with a metal or other conductive material. Vertical FinFET 250 may include, e.g., a first source/drain contact 240 extending from the top of ILD 130 to first source/drain region 204, and a second source/drain contact 242 extending from the top of ILD 130 to second source/drain region 224. One or more gate contacts 244a, 244b may extend from the top of ILD 130, through the body of ILD 130, to land on first gate 230 or second gate 232. As shown, first gate contact 244a may connect a first voltage source V1 to first gate 130. Second gate contact 244b may connect a second voltage source V2 to second gate 132. First voltage source V1 and second voltage source V2 may be independent from each other, allowing for independent gate control of vertical FinFET 250 through first gate 230 or second gate 232.

Vertical FinFET 250 may include structural features directly related to the processing techniques discussed herein, and related operational advantages. Vertical FinFET 250 may include first source/drain region 204 overlying substrate 202 and positioned along the outer perimeter of insulator region 214. Looped channel region 222 may be positioned on and overlie the upper surface of first source/drain region 204, and as discussed herein may surround portions of gate dielectric 228 and first gate 230 located laterally within the interior perimeter of looped channel region 222. The sidewall-to-sidewall lateral width of first gate 230 within looped channel region 222 may be up to approximately fort nanometers (nm) to provide a compact device architecture. First source/drain contact 240 may provide an electrical connection to first source/drain region 204.

First gate 230 and corresponding portions of gate dielectric 228 thus may be positioned within the hollow interior of looped channel region 222 formed alongside the inner perimeter of looped channel region 222. Second gate 232 and corresponding portions of gate dielectric 228, where applicable, may be formed alongside the outer perimeter of looped channel region 222, while also being directly laterally adjacent to looped channel region 222. Looped channel region 222 thus may be directly interposed between portions of gate dielectric 228 positioned alongside first and second gates 230, 232. Gate contacts 244*a*, 244*b* may provide respective electrical connections from external voltage sources (e.g., V1, V2) to first and second gates 230, 232. Each gate 230, 232 may include a conductive material separated from underlying and adjacent materials by portions of gate dielectric 228 as discussed elsewhere herein. Second source/drain region 224 may be positioned on at least part of the upper surface of looped channel region 222, with second source/drain contact 242 providing an electrical connection to second source/drain region 224.

The methods as described above are used in the fabrication of integrated circuit chips. The resulting integrated circuit chips may be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product may be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vertical FinFET structure, comprising:
    a substrate including a first source/drain region;
    a looped channel region positioned on the first source/drain region of the substrate, the looped channel region having an inner perimeter sidewall which surrounds and laterally encloses an interior of the looped channel region, and an outer perimeter sidewall opposite the inner perimeter sidewall;
    a first gate positioned within the interior of the looped channel region and laterally abutting the inner perimeter sidewall, such that the first gate is circumferentially enclosed entirely within the interior of the looped channel region; and
    a second source/drain region positioned on and overlying an upper surface of the looped channel region.

2. The vertical FinFET of claim 1, further comprising a second gate formed onto the looped channel region along the outer perimeter sidewall of the looped channel region, wherein the looped channel region is directly interposed between the first and second gates, and wherein the looped channel region is circumferentially enclosed entirely within an interior of the second gate.

3. The vertical FinFET of claim 2, further comprising:
    a first gate contact electrically connecting to the first gate within the interior of the looped channel region; and
    a second gate contact electrically connecting to the second gate outside the outer perimeter sidewall of the looped channel region, wherein the first gate contact is electrically independent from the second gate contact.

4. The vertical FinFET of claim 1, wherein the second source/drain region comprises an epitaxial semiconductor material grown on an upper surface of the looped channel region.

5. The vertical FinFET of claim 1, wherein the first gate includes:
    a gate dielectric formed onto the inner perimeter sidewall of the looped channel region, the gate dielectric having an inner perimeter sidewall which surrounds an interior of the gate dielectric; and
    a gate metal positioned within the interior of the gate dielectric, wherein the gate dielectric is formed onto the gate metal along the inner perimeter sidewall of the gate dielectric.

6. The vertical FinFET of claim 1, further comprising a first spacer positioned above the first source/drain region, wherein the first gate is positioned above the first spacer.

7. The vertical FinFET of claim 6, further comprising a second spacer positioned on an upper surface of the first gate and alongside the inner perimeter sidewall of the looped channel region.

8. The vertical FinFET of claim 1, wherein a lateral width of the first gate within the looped channel region is at most approximately forty nanometers (nm).

9. The vertical FinFET of claim 1, further comprising a shallow trench isolation (STI) positioned on the substrate and surrounding an outer perimeter sidewall of the first source/drain region.

10. A vertical FinFET structure, comprising:
    a substrate including a first source/drain region;
    a looped channel region positioned on the first source/drain region of the substrate, the looped channel region having an inner perimeter sidewall which surrounds and laterally encloses an interior of the looped channel region, and an outer perimeter sidewall opposite the inner perimeter sidewall;
    an insulator region positioned on the substrate and within the interior of the looped channel region, wherein the insulator region is formed onto the looped channel region alongside the inner perimeter sidewall of the looped channel region; and;
    a first gate positioned within the interior of the looped channel region and laterally abutting the inner perimeter sidewall, such that the first gate is circumferentially enclosed entirely within the interior of the looped channel region; and a second source/drain region positioned on and overlying an upper surface of the looped channel region.

11. The vertical FinFET of claim 10, further comprising a second gate formed onto the looped channel region along the outer perimeter sidewall of the looped channel region, wherein the looped channel region is directly interposed between the first and second gates, and wherein the looped channel region is circumferentially enclosed entirely within an interior of the second gate.

12. The vertical FinFET of claim 11, further comprising:
a first gate contact electrically connecting to the first gate within the interior of the looped channel region; and
a second gate contact electrically connecting to the second gate outside the outer perimeter sidewall of the looped channel region, wherein the first gate contact is electrically independent from the second gate contact.

13. The vertical FinFET of claim 10, wherein the first gate includes:
a gate dielectric formed onto the inner perimeter sidewall of the looped channel region, the gate dielectric having an inner perimeter sidewall which surrounds an interior of the gate dielectric; and
a gate metal positioned within the interior of the gate dielectric, wherein the gate dielectric is formed onto the gate metal along the inner perimeter sidewall of the gate dielectric.

14. The vertical FinFET of claim 10, wherein a lateral width of the first gate within the looped channel region is at most approximately forty nanometers (nm).

15. A vertical FinFET structure, comprising:
a substrate including a first source/drain region;
a looped channel region positioned on the first source/drain region of the substrate, the looped channel region having an inner perimeter sidewall which surrounds and laterally encloses an interior of the looped channel region, and an outer perimeter sidewall opposite the inner perimeter sidewall;
a first gate positioned within the interior of the looped channel region and laterally abutting the inner perimeter sidewall, such that the first gate is circumferentially enclosed entirely within the interior of the looped channel region:
a gate dielectric formed onto the inner perimeter sidewall of the looped channel region, the gate dielectric having an inner perimeter sidewall which surrounds an interior of the gate dielectric, and
a gate metal positioned within the interior of the gate dielectric, wherein the gate dielectric formed onto the gate metal along the inner perimeter sidewall of the gate dielectric;
a second gate formed onto the looped channel region along the outer perimeter sidewall of the looped channel region, wherein the looped channel region is directly interposed between the first and second gates, and wherein the looped channel region is circumferentially enclosed entirely within an interior of the second gate;
a second source/drain region positioned on and overlying an upper surface of the looped channel region.

16. The vertical FinFET of claim 15, further comprising:
a first gate contact electrically connecting the first gate within the interior of the looped channel region; and
a second gate contact electrically connecting to the second gate outside the outer perimeter sidewall of the looped channel region.

17. The vertical FinFET of claim 16, further comprising a first spacer positioned above the first source/drain region, wherein the first gate is positioned above the first spacer.

18. The vertical FinFET of claim 17, further comprising a second spacer positioned on an upper surface of the first gate and alongside the inner perimeter sidewall of the looped channel region.

19. The vertical FinFET of claim 15, wherein a lateral width of the first gate within the looped channel region is at most approximately forty nanometers (nm).

20. The vertical FinFET of claim 15, wherein the second source/drain region comprises an epitaxial semiconductor material grown on an upper surface of the looped channel region.

* * * * *